United States Patent
Choi

(10) Patent No.: US 10,553,635 B2
(45) Date of Patent: Feb. 4, 2020

(54) IMAGE SENSOR, STACKED IMAGE SENSOR, IMAGE PROCESSING APPARATUS, AND METHOD OF FABRICATING IMAGE SENSOR CHIP PACKAGE

(71) Applicant: SAMSUNG ELECTRONICS CO., LTD., Suwon-si, Gyeonggi-do (KR)

(72) Inventor: Min-jun Choi, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 142 days.

(21) Appl. No.: 15/274,077

(22) Filed: Sep. 23, 2016

(65) Prior Publication Data

US 2017/0092682 A1    Mar. 30, 2017

(30) Foreign Application Priority Data

Sep. 25, 2015  (KR) ........................ 10-2015-0137104

(51) Int. Cl.
| | |
|---|---|
| H04N 5/225 | (2006.01) |
| H01L 27/146 | (2006.01) |
| G11C 29/00 | (2006.01) |
| H01L 21/66 | (2006.01) |
| H04N 5/357 | (2011.01) |
| H04N 5/378 | (2011.01) |
| G11C 17/16 | (2006.01) |
| G11C 17/18 | (2006.01) |

(52) U.S. Cl.
CPC ........ *H01L 27/14638* (2013.01); *G11C 29/78* (2013.01); *H01L 22/20* (2013.01); *H01L 27/14609* (2013.01); *H01L 27/14621* (2013.01); *H01L 27/14627* (2013.01); *H01L 27/14636* (2013.01); *H04N 5/3575* (2013.01); *H04N 5/378* (2013.01); *G11C 17/16* (2013.01); *G11C 17/18* (2013.01)

(58) Field of Classification Search
None
See application file for complete search history.

(56) References Cited

U.S. PATENT DOCUMENTS

| | | | |
|---|---|---|---|
| 8,848,443 B2 | 9/2014 | Kim | |
| 2002/0167850 A1 | 11/2002 | Lee | |
| 2008/0309532 A1* | 12/2008 | Lin | H04N 5/367 341/137 |
| 2012/0133794 A1* | 5/2012 | Silsby | H04N 5/367 348/231.99 |
| 2013/0033632 A1* | 2/2013 | Kishi | H01L 27/14634 348/308 |
| 2014/0013185 A1 | 1/2014 | Kobla et al. | |
| 2014/0208151 A1 | 7/2014 | Fernandez | |

(Continued)

FOREIGN PATENT DOCUMENTS

| | | |
|---|---|---|
| KR | 10-2012-0122549 A | 11/2012 |
| KR | 10-2014-0050975 A | 4/2014 |
| KR | 10-2015-0055933 A | 5/2015 |

*Primary Examiner* — Twyler L Haskins
*Assistant Examiner* — Dwight Alex C Tejano
(74) *Attorney, Agent, or Firm* — Lee & Morse, P.C.

(57) ABSTRACT

An image sensor includes a pixel array and a peripheral circuit. The peripheral circuit is electrically connected to the pixel array and includes a logic block and at least one redundancy block to replace the logic block when the logic block is a defective block.

20 Claims, 26 Drawing Sheets

(56) References Cited

U.S. PATENT DOCUMENTS

2015/0043288 A1 2/2015 Kim
2015/0135040 A1 5/2015 Lee et al.
2015/0154933 A1 6/2015 Bae et al.

* cited by examiner

IMAGE SENSOR, STACKED IMAGE SENSOR, IMAGE PROCESSING APPARATUS, AND METHOD OF FABRICATING IMAGE SENSOR CHIP PACKAGE

CROSS-REFERENCE TO RELATED APPLICATION

Korean Patent Application No. 10-2015-0137104, filed on Sep. 25, 2015, and entitled, "Image Sensor, Stacked Image Sensor, Image Processing Apparatus, and Method of Fabricating Image Sensor Chip Package," is incorporated by reference herein in its entirety.

BACKGROUND

1. Field

One or more embodiments described here relate to an image sensor, a stacked image sensor, an image processing apparatus, and a method for fabricating an image sensor chip package.

2. Description of the Related Art

An image sensor converts an optical image to electric signals. Examples of image sensors include charge-coupled device (CCD) image sensors and complementary metal-oxide semiconductor (CMOS) image sensors. In a CMOS image sensor, each pixel converts signal charges output from a photodiode to a voltage. A plurality of transistors may be used to perform the conversion. Current methods for fabricating CMOS image sensors are complicated and expensive and/or have other drawbacks.

SUMMARY

In accordance with one or more embodiments, an image sensor includes a pixel array including a plurality of pixels; and a peripheral circuit electrically connected to the pixel array, wherein the peripheral circuit includes a logic block and at least one redundancy block to replace the logic block when the logic block is a defective block. The peripheral circuit may include a repair circuit to select one of the logic block or the at least one redundancy block based on a test result of the logic block or the at least one redundancy block. The repair circuit may include a defective block storage area to store defective block information indicating results of testing the logic block or the at least one redundancy block; and repair logic to select one of the logic block or the at least one redundancy block based on the defective block information. The defective block storage area may include a one-time programmable (OTP) memory block or a fuse block.

The peripheral circuit may include a plurality of logic blocks, the repair circuit may include a plurality of repair logic respectively corresponding to the logic blocks, and each repair logic may select a corresponding logic block or a redundancy block for the corresponding logic block based on results of testing the corresponding logic block.

The peripheral circuit may include a plurality of logic blocks and the repair circuit may include repair logic to select at least one of the logic blocks or a corresponding redundancy block based on results of testing the logic blocks. The pixel array may be on a first wafer, the peripheral circuit may be on a second wafer, and the first wafer may be vertically stacked on the second wafer. The pixel array may be on a first region of a wafer, and the peripheral circuit may be on a second region of the wafer. The logic block may include a row driver to select at least one of the pixels and the at least one redundancy block may include at least one redundancy row driver to replace the row driver.

The logic block may include a correlated double sampling (CDS) block to perform a CDS operation on a pixel signal output by the pixel array and output a CDS pixel signal, and the at least one redundancy block may include at least one redundancy CDS block to replace the CDS block. The logic block may include a comparator block to compare the CDS pixel signal with a ramp signal and output a comparison signal, and the at least one redundancy block includes at least one redundancy comparator block to replace the comparator block.

The logic block may include an analog-to-digital converting (ADC) block to count the comparison signal in response to a clock signal and output digital data, and the at least one redundancy block may include at least one redundancy ADC block to replace the ADC block. The logic block may include a buffer to store the digital data in frame units, and the at least one redundancy block may include at least one redundancy buffer to replace the buffer.

The logic block may include a ramp signal generator to generate the ramp signal, and the at least one redundancy block may include at least one redundancy ramp signal generator to replace the ramp signal generator. The logic block may include a timing generator to generate a timing signal for controlling an operation of the CDS block, and the at least one redundancy block may include at least one redundancy timing generator to replace the timing generator.

In accordance with one or more other embodiments, a stacked image sensor includes a first chip including a pixel array of a plurality of pixels; and a second chip electrically connected to the pixel array and including a logic block and at least one redundancy block to replace the logic block when the logic block is a defective block, wherein the first and second chips are vertically stacked. The first chip may include a color filter layer on a first surface of the first chip and over the pixel array and a microlens layer on the color filter layer on the first surface of the first chip, wherein the second chip is adjacent to a second surface of the first chip, which is opposite to the first surface of the first chip. The stacked image sensor may include an interconnector to electrically connect the first and second chips.

In accordance with one or more other embodiments, an image processing apparatus includes an image sensor; and a digital signal processor to process image data output from the image sensor and to display the processed image data, wherein the image sensor includes: a pixel array including a plurality of pixels; and a peripheral circuit electrically connected to the pixel array and including a logic block and at least one redundancy block to replace the logic block when the logic block is a defective block. The image sensor may be a stacked image sensor, the pixel array may be on a first wafer, the peripheral circuit may be on a second wafer, and the first wafer may be vertically stacked on the second wafer.

In accordance with one or more other embodiments, a method for fabricating an image sensor chip package includes providing a wafer including semiconductor chips, each semiconductor chip including a pixel array, a logic block, and a redundancy block; performing a test process on the wafer to determine whether the logic block is a defective block for each of the semiconductor chips; replacing the logic block with the redundancy block when the logic block is determined to be a defective block based on results of the test process, for each of the semiconductor chips; separating the semiconductor chips in the wafer to provide discrete image sensor chips; and packaging the image sensor chips.

Providing the wafer may include providing a first wafer which includes a plurality of upper semiconductor chips, each including the pixel array; and providing a second wafer which includes a plurality of lower semiconductor chips, each including the logic block and the redundancy block.

The method may include providing a stack wafer structure by stacking the first wafer and the second wafer and bonding the first and second wafers to each other, wherein performing the test process includes performing a test process on the stack wafer structure. The method may include performing a test process on the wafer to determine whether the redundancy block is a defective block, for each of the semiconductor chips; and replacing the redundancy block with another redundancy block when the redundancy block is determined as a defective block based on results of the test process, for each of the semiconductor chips.

The method may include performing a second test process on each of the discrete image sensor chips to determine whether any logic blocks in the discrete image sensor chips are defective blocks; and replacing the logic block with the redundancy block when the logic block is determined to be a defective block based on results of the second test process, for each of the discrete image sensor chips.

In accordance with one or more other embodiments, an apparatus includes a connector; and a first chip including the connector, a logic block, a redundancy logic block, and repair logic, the redundancy logic block to replace the logic block based on a control signal from the repair logic when the logic block is defective, the connector to connect the first chip to a pixel array of an image sensor. The apparatus may include a second chip vertically connected to the first chip through at least the connector, wherein the second chip includes the pixel array. The control signal may be generated based on a test of the logic block. The connector may include at least one pad. The first chip may include a storage area to store defective block information; and the repair logic may select the logic block or the redundancy block based on the defective block information.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
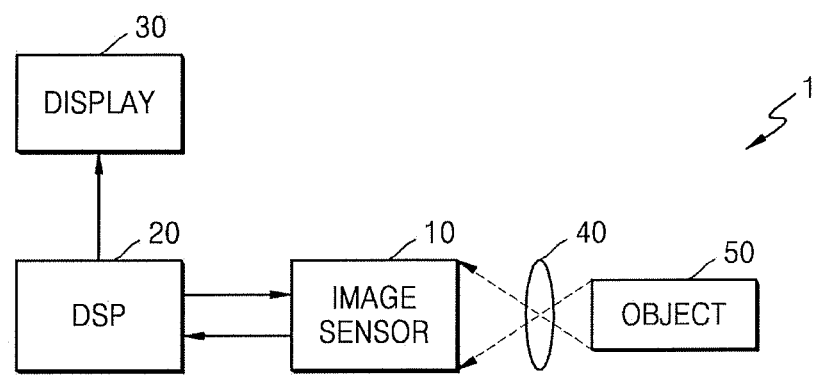
FIG. 1 illustrates an embodiment of an image processing apparatus.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing particular embodiments only and is not intended to have a limiting effect. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated integers, steps, operations, elements, and/or components, but do not preclude the presence or addition of one or more other integers, steps, operations, elements, components, and/or groups thereof.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the embodiments.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless explicitly so defined.

FIG. 1 illustrates an embodiment of an image processing apparatus 1 which includes an image sensor 10, a digital signal processor (DSP) 20, and a display 30. The image processing apparatus 1 may be, for example, a portable electronic device including or coupled to a digital camera. Examples of the portable electronic device include a mobile phone, a smartphone, or a tablet personal computer (tablet PC).

The image sensor 10 may be a semiconductor device that converts an optical image to an electric signal. For example, the image sensor 10 may be a complementary metal-oxide-semiconductor (CMOS) image sensor. The image sensor 10 may generate image data indicating an object 50 according to light incident through a lens 40. The image sensor 10 may output the generated image data to the DSP 20.

According to the present embodiment, the image sensor 10 may include a peripheral circuit unit electrically connected to a pixel array. The peripheral circuit unit may include a plurality of logic blocks and at least one redundancy block corresponding to each of the logic blocks. Thus, even if one of the logic blocks fails, the failed block may be replaced with a redundancy block so that the image sensor 10 may remain in operable condition.

The DSP 20 may process image data output by the image sensor 10 and transmit the processed image data to the display 30. In an exemplary embodiment, each of the image sensor 10 and the DSP 20 may be embodied by a printed circuit board (PCB) such as a motherboard, an integrated circuit (IC), or a System on Chip (SoC). In an exemplary embodiment, the image sensor 10 and the DSP 20 may be embodied by a single package, e.g., a multi-chip package (MCP) or a system in package (SiP). In an exemplary embodiment, the image sensor 10 may be embodied by a separate chip, e.g., a CMOS image sensor chip.

The display 30 may display image data received from the DSP 20. The display 30 may be, for example, a thin film transistor liquid crystal display (TFF-LCD), a light emitting diode (LED) display, an organic LED (OLED) display, or an active-matrix OLED (AMOLED) display.

Figure 2:
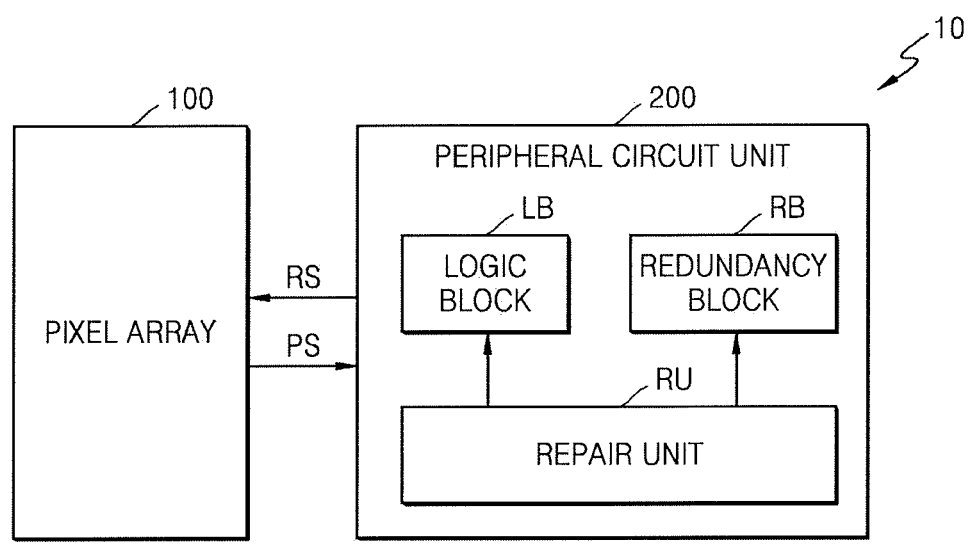
FIG. 2 illustrates an embodiment of an image sensor.

FIG. 2 illustrates an embodiment of an image sensor which includes a pixel array 100 and a peripheral circuit unit 200. The image sensor may be image sensor 10 in FIG. 1. The pixel array 100 may include a plurality of pixels. The peripheral circuit unit 200 may be electrically connected to the pixel array 100 and provide a row signal RS to the pixel array 100 or receive a pixel signal PS from the pixel array 100.

In the present embodiment, the peripheral circuit unit 200 may include a logic block LB and a redundancy block RB. The logic block LB may be a logic circuit including a plurality of logic devices, each of which may receive a power signal or a control signal and perform a logic operation in response to the received power signal or control signal. The logic block LB may be a predetermined function block, which may be referred to as a digital block or an intellectual property (IP) block. Although only one logic LB is illustrated in FIG. 2, the peripheral circuit unit 200 may include a plurality of logic blocks in another embodiment. Also, the peripheral circuit unit 200 may include analog circuits in at least one embodiment.

The redundancy block RB may be a preliminary logic block to replace the logic block LB when the logic block LB is a defective block. The redundancy block RB may be referred to as a redundancy logic block. The redundancy block RB may be a function block designed to correspond to the logic block LB. The redundancy block RB may be a logic circuit including a plurality of logic devices for performing the same logic operation as the logic block LB. Although only one redundancy block RB is illustrated in FIG. 2, the peripheral circuit unit 200 may include a plurality of redundancy blocks corresponding to one logic block LB in another embodiment. The number of redundancy blocks RB may be adaptively determined, for example, by a spare space in an area in which the image sensor 10 is embodied.

In addition, the peripheral circuit unit 200 may include a repair unit RU. In an exemplary embodiment, the repair unit RU may select the logic block LB or the redundancy block RB based on results generated by testing the logic block LB. In some embodiments, testing the logic block LB may be performed on a wafer level. For example, testing the logic block LB may be performed before discrete chips are separated. In some embodiments, testing the logic block LB may be performed on a chip level, e.g., testing the logic block LB may be performed after the discrete chips are separated.

If testing the logic block BL indicates that the logic block LB is a normal block, the repair unit RU may not perform a repair operation on the logic block LB, but rather may select the logic block LB. For example, the repair unit RU may electrically connect the pixel array 100 with the logic block LB and provide a power signal or a control signal to the logic block LB. In this case, the repair unit RU may not provide electrical connection to the redundancy block RB. For example, the repair unit RU may not provide a power signal and a control signal to the redundancy block RB.

If testing of the logic block LB indicates that the logic block LB is a defective block, the repair unit RU may perform a repair operation on the logic block LB and select the redundancy block RB in place of the logic block LB. For example, the repair unit RU may electrically connect the pixel array 100 with the redundancy block RB and provide a power signal or a control signal to the redundancy block RB. In this case, the repair unit RU may not provide electrical connection to the logic block LB. For example, repair unit RU may not provide a power signal and a control signal to logic block LB.

In an exemplary embodiment, the repair unit RU may select the logic block LB or the redundancy block RB based on results of the testing of the logic block LB and the redundancy block RB. For example, if the testing of the logic block LB indicates that the logic block LB is a defective block, the repair unit RU may select the redundancy block RB based on the result of testing of the redundancy block RB.

If testing of the redundancy block RB indicates that the redundancy block RB is a normal block, the repair unit RU may perform a repair operation on the logic block LB and select the redundancy block RB in place of the logic block LB. For example, the repair unit RU may electrically connect the pixel array 100 with the redundancy block RB and provide a power signal or a control signal to the redundancy block RB. In this case, the repair unit RU may not provide electrical connection to the logic block LB, e.g., the repair unit RU may not provide a power signal or a control signal to the logic block LB.

If the testing of the redundancy block RB indicates that the redundancy block RB is a defective block, the repair unit RU may perform a repair operation on the redundancy block RB and select another redundancy block in place of the redundancy block RB. For example, the repair unit RU may electrically connect the pixel array 100 with another redundancy block and provide a power signal or a control signal to the other redundancy block. In this case, the repair unit RU may not provide electrical connection to the logic block LB and the redundancy block RB. For example, the repair unit RU may not provide a power signal and a control signal to the logic block LB and the redundancy block RB.

Figure 3:
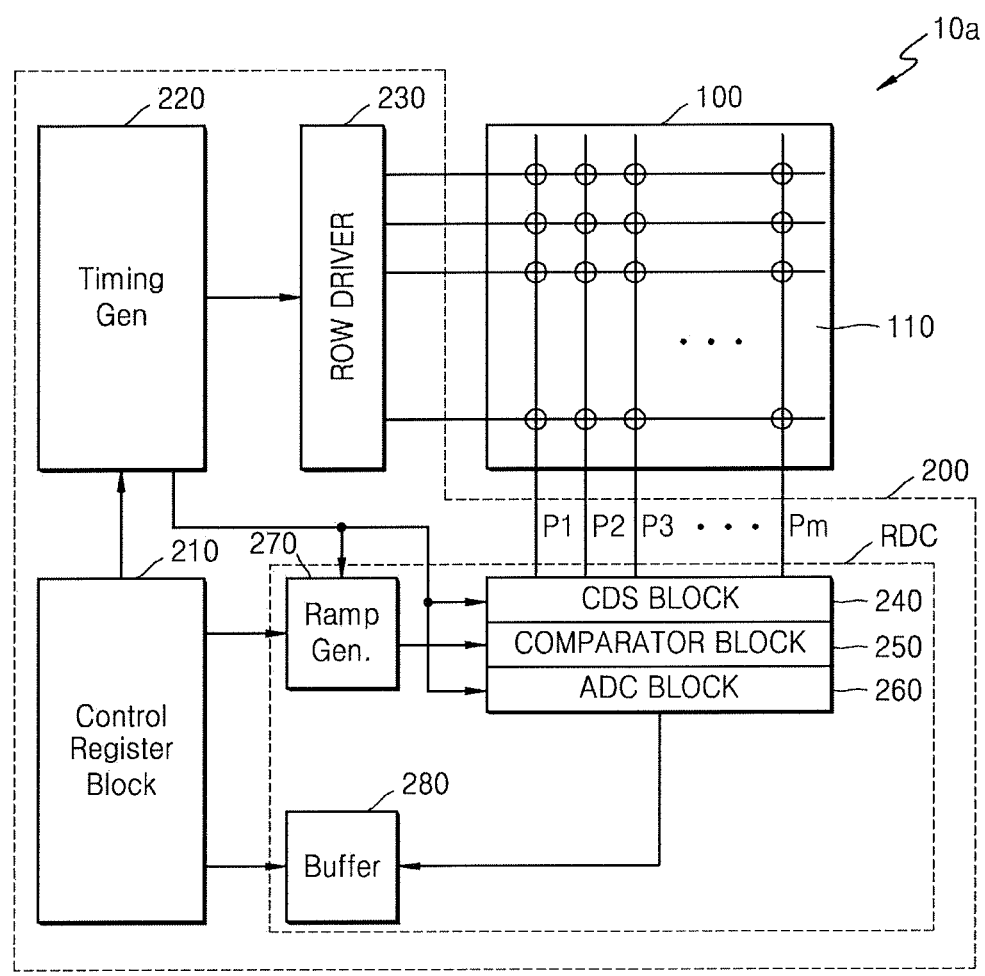
FIG. 3 illustrates another embodiment of an image sensor.

FIG. 3 illustrates an embodiment of an image sensor 10a which includes a pixel array 100 and a peripheral circuit 200. The pixel array 100 and the peripheral circuit 200 may respectively correspond to the pixel array 100 and the peripheral circuit 200 in FIG. 2. The peripheral circuit 200 may include a control register block 210, a timing generator 220, a row driver 230, a correlated double sampling (CDS) block 240, a comparator block 250, an analog-to-digital converting (ADC) block 260, a ramp signal generator 270, and a buffer 280. In this case, the CDS block 240, the comparator block 250, the ADC block 260, the ramp signal generator 270, and the buffer 280 may constitute a read-out circuit (RDC).

Figure 4A:
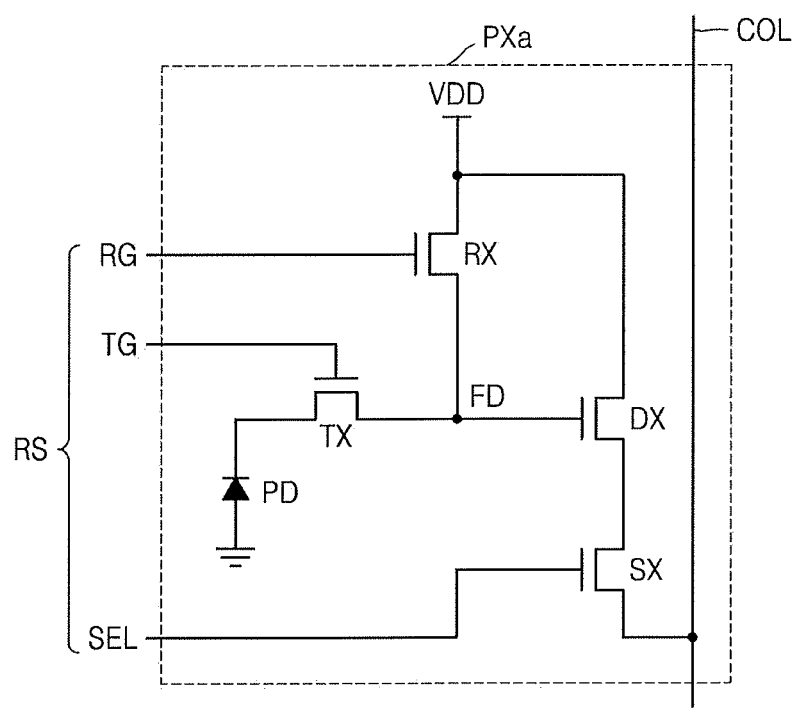
FIGS. 4A to 4C illustrate embodiments of unit pixels.
Figure 4B:
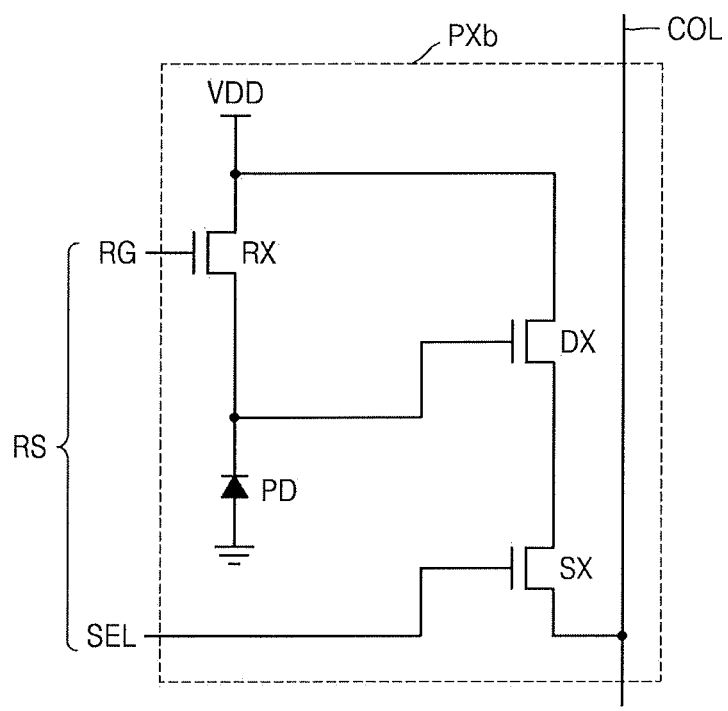
Figure 4C:
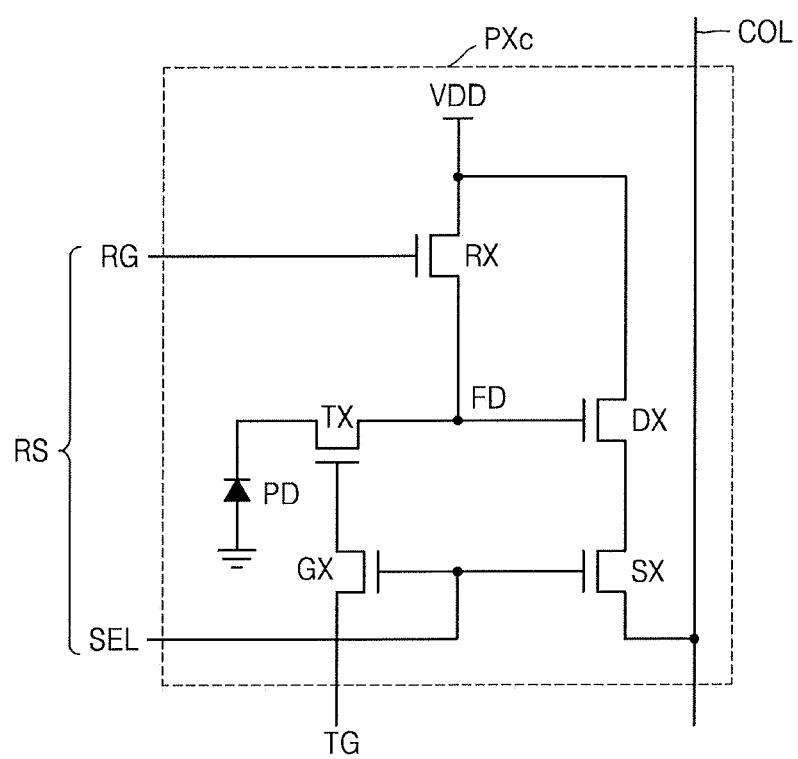

The pixel array 100 may include a plurality of pixels 110 arranged in a matrix shape. Each pixel 110 may be connected between a row line and a column line and output a pixel signal (e.g., PS in FIG. 2) according to incident light. In an exemplary embodiment, each pixel 110 may have a multilayered structure including an organic photoelectric converter or an inorganic photoelectric converter. In an exemplary embodiment, each pixel 110 may have a multilayered structure in which only organic photoelectric converters are stacked. Each of the pixels 110 may be embodied, for example, as shown in FIGS. 4A to 4C.

The timing generator 220 may generate control signals to control operation time points of the image sensor 10a. For example, the timing generator 220 may control operations of the row driver 230, the CDS block 240, the ADC block 260, and the ramp signal generator 270 under control of the control register block 210. According to the present embodiment, the peripheral circuit unit 200 may further include at least one redundancy timing generator for replacing the timing generator 220.

The row driver 230 may drive at least one of a plurality of row lines of the pixel array 100 under the control of the timing generator 22. For example, the row driver 230 may provide a row signal (e.g., RS in FIG. 2) to each of the plurality of row lines of the pixel array 100. The row signal may include a plurality of control signals for controlling a plurality of transistors in a unit pixel. According to the present embodiment, the peripheral circuit unit 200 may further include at least one redundancy row driver for replacing the row driver 230. Also, the peripheral circuit unit 200 may include a row decoder and at least one redundancy row decoder for replacing the row decoder.

The CDS block 240 may receive pixel signals P1 to Pm (m is a natural number) from a plurality of column lines in the pixel array 100 and perform a CDS operation on each of the received pixel signals P1 to Pm. For example, the CDS block 240 may doubly sample a specific noise level and a signal level corresponding to the received pixel signal and output a difference level corresponding to a difference between the noise level and the signal level. Each of the pixel signals P1 to Pm may correspond to the pixel signal PS of FIG. 2. In the present embodiment, the peripheral circuit unit 200 may further include at least one redundancy CDS block for replacing the CDS block 240.

The comparator block 250 may compare each of CDS pixel signals output by the CDS block 240 with a ramp signal output by the ramp signal generator 270 and output comparison signals. In the present embodiment, peripheral circuit unit 200 may further include at least one redundancy comparator block for replacing the comparator block 250.

The ADC block 260 may count comparison signals in response to a clock signal, convert each of a plurality of comparison signals output by the comparator block 250 to digital data, and output a plurality of pieces of digital data to the buffer 280. In the present embodiment, the peripheral circuit unit 200 may further include at least one redundancy ADC block for replacing the ADC block 260.

The ramp signal generator 270 may generate a ramp signal under the control of the timing generator 220. By using a current-mode digital-to-analog converter (DAC) or voltage-current (V-I) converter, the ramp signal generator 270 may be configured such that the voltage level of a ramp signal varies with current over time. The ramp signal may be generated, for example, as a voltage having a single slope provided to the comparator block 250 and compared with the pixel signal output by the pixel array 100. In the present embodiment, peripheral circuit unit 200 may further include at least one redundancy ramp signal generator for replacing the ramp signal generator 270.

The control register block 210 may control operations of the timing generator 220, the ramp signal generator 270, and the buffer 280 under the control of a DSP (e.g., the DSP 20 in FIG. 1). In the present embodiment, the peripheral circuit unit 200 may further include at least one redundancy control register block for replacing the control register block 210.

The buffer 280 may store digital data output by the ADC block 260 in frame units. Thus, the buffer 280 may be referred to as a frame memory or a buffer memory. The buffer 280 may output digital data, which are stored in the frame units, to a DSP (e.g., the DSP 20 in FIG. 1). In the present embodiment, the peripheral circuit unit 200 may further include at least one redundancy buffer for replacing the buffer 280.

In some embodiments, the image sensor 10a may further include an image signal processor (ISP). The ISP may perform a signal processing operation on raw data stored in the buffer 280 and output image data. In some embodiments, the ISP may be embodied in the DSP (e.g., the DSP 20 in FIG. 1).

In one embodiment, the ISP may include a plurality of logic blocks to perform signal processing operations (e.g., color interpolation, color correction, auto white balance, gamma correction, color saturation correction, format correction, bad pixel correction, hue correction, auto expose, auto focus, and/or phase defector auto focus (PDAF)) on raw data. In an exemplary embodiment, the peripheral circuit unit 200 may further include at least one redundancy block corresponding to each of the logic blocks in the ISP.

In some embodiments, the image sensor 10a may further include a voltage doubler to increase a voltage using a charge pump and a redundancy voltage doubler. In some embodiments, the image sensor 10a may further include a reference voltage generating block and a redundancy reference voltage generating block. In some embodiments, the image sensor 10a may further include a reference current generating block and a redundancy reference current generating block. In some embodiments, the image sensor 10a may further include a communication block (e.g., a Mipi block) and a redundancy communication block.

FIGS. 4A to 4C are circuit diagrams of unit pixels according to some exemplary embodiments. Referring to FIG. 4A, a unit pixel PXa may include a photodiode PD, a transfer transistor TX, a reset transistor RX, a drive transistor DX, and a selection transistor SX. The unit pixel PXa may correspond to the pixel 110 in FIG. 3.

The unit pixel PXa may receive a row signal RS from an external source, e.g., the row driver 230 in FIG. 3. The row signal RS may include a reset signal RG applied to a gate of the reset transistor RX, a transfer signal TG applied to a gate of the transfer transistor TX, and a selection signal SEL applied to a gate of the selection transistor SX. Also, the unit pixel PXa may generate a pixel signal PS according to the intensity of sensed light and output the generated pixel signal PS to an external area, e.g., the CDS block 240 in FIG. 3.

The photodiode PD may receive light and generate photocharges and, thus, may be referred to as a photodetector. The photodiode PD may include at least one of a photogate, a pinned photodiode PPD, or a combination thereof. The transfer transistor TX may transfer photocharges generated by the photodiode PD to a floating diffusion region FD. The reset transistor RX may periodically reset charges stored in the floating diffusion region FD. The drive transistor DX may serve as a source follower buffer and buffer a signal corresponding to charges filled in the floating diffusion region FD. The selection transistor SX may perform switching and addressing operations to select the unit pixel PXa.

FIG. 4A illustrates a 4-transistor (4T)-type unit pixel including a single photodiode PD and four MOS transistors TX, RX, DX, and SX. In another embodiment, the unit pixel may include a different number of transistors, e.g., at least three transistors including a drive transistor DX and a selection transistor SX, and a photodiode PD. Unit pixels according to other exemplary embodiments are illustrated in FIGS. 4B and 4C.

Referring to FIG. 4B, unit pixel PXb may be a 3-transistor (3T)-type unit pixel and may include a photodiode PD, a reset transistor RX, a drive transistor DX, and a select transistor SX. Referring to FIG. 4C, unit pixel PXc may be a 5-transistor (5T)-type unit pixel and may include a photodiode PD, a reset transistor RX, a drive transistor DX, and a select transistor SX and may further include a single transistor GX.

Figure 5:
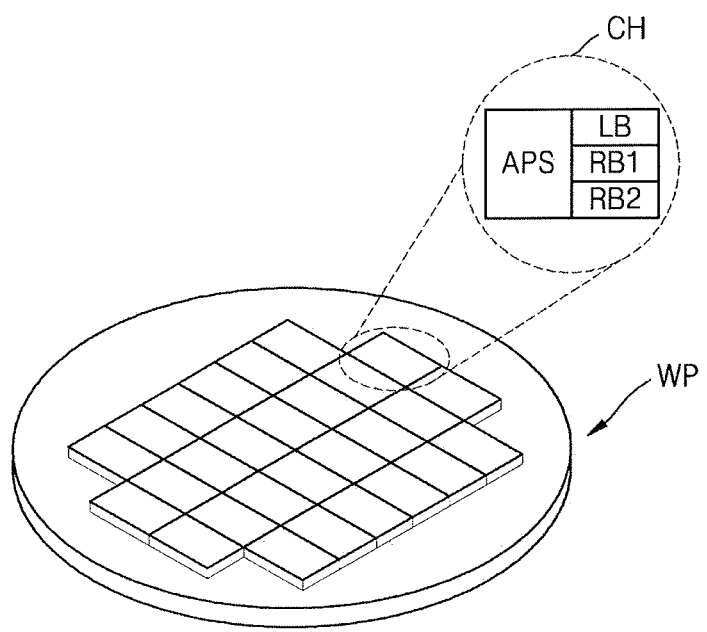
FIG. 5 illustrates an embodiment of a wafer.

FIG. 5 illustrates an embodiment of a wafer WP which includes a plurality of image sensor chips CH. The image sensor chips CH may be arranged, for example, in a two dimensional pattern on one surface of the wafer WP.

Each image sensor chip CH may include an active pixel sensor APS, a logic block LB, and first and second redundancy blocks RB1 and RB2. The active pixel sensor APS may correspond to a pixel array, e.g., the pixel array 100 in FIG. 2. The logic block LB and the first and second redundancy blocks RB1 and RB2 may correspond to a peripheral circuit unit, e.g., the peripheral circuit unit 200 in FIG. 2. Thus, according to the present embodiment, each image sensor chip CH may include the pixel array and the peripheral circuit unit. Accordingly, the pixel array and the peripheral circuit unit may be formed using one wafer WP.

Figure 6:
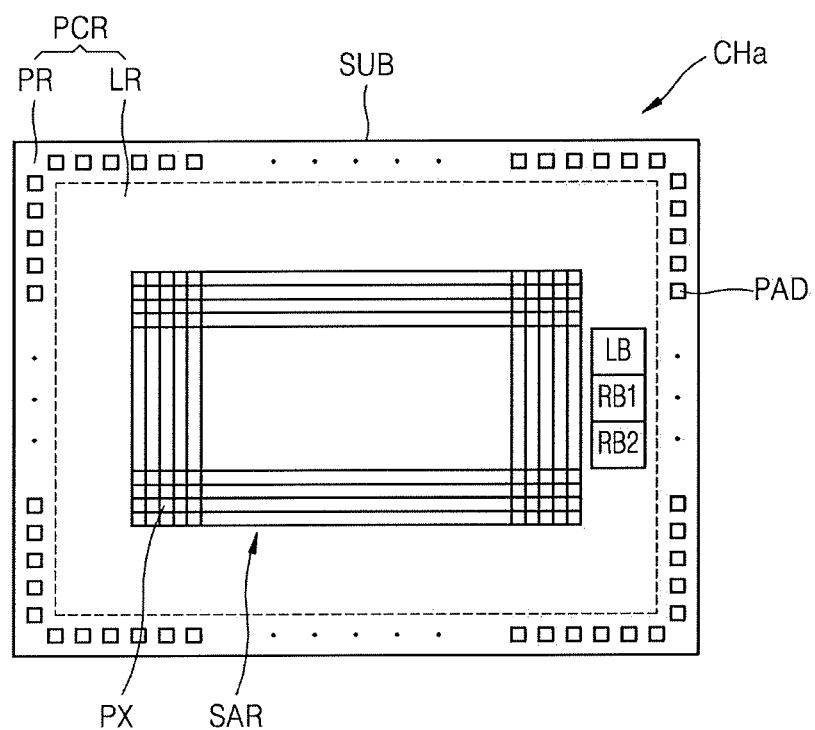
FIG. 6 illustrates an embodiment of an image sensor chip.

FIG. 6 is a plan view of an embodiment of image sensor chip CHa which includes a sensor array region sensor array region SAR, a logic region LR, and a pad region PR formed on a semiconductor substrate SUB. In contrast to the sensor array region SAR, the logic region LR and the pad region PR may be referred to together as a peripheral circuit region PCR. The peripheral circuit region PCR may refer to a region other than the sensor array region SAR in the semiconductor substrate SUB in the image sensor chip CHa. The image sensor chip CHa according to the present embodiment may be an example of the image sensor chip CH in FIG. 5.

The semiconductor substrate SUB may include, for example, silicon (Si). Alternatively, the semiconductor substrate SUB may include a semiconductor material, e.g., germanium (Ge)) or a compound semiconductor (e.g., silicon carbide (SiC), gallium arsenide (GaAs), indium arsenide (InAs), and indium phosphide (InP). Alternatively, the semiconductor substrate SUB may include a silicon-on-insulator (SOI) structure or a buried oxide layer (BOX) layer. The semiconductor substrate SUB may include a conductive region, for example, a doped well or a doped structure. Furthermore, the semiconductor substrate SUB may have one of various isolation structures, e.g., a shallow trench isolation (STI) structure.

The sensor array region SAR may include a plurality of unit pixels PX arranged in a matrix shape. The logic region LR may be located, for example, along an edge of the sensor array region SAR. FIG. 6 illustrates a case in which the logic region LR is located along all four edges of the sensor array region SAR. In other exemplary embodiments, the logic region LR may be located along a different number (e.g., two or three) of edges of the sensor array region SAR.

The logic region LR may include electronic devices having a plurality of transistors. The logic region LR may provide a predetermined signal to each of the unit pixels PX of the sensor array region SAR or control an output signal. According to the present embodiment, a logic block LB and first and second redundancy blocks RB1 and RB2 may be located in the logic region LR. In the present embodiment, the logic block LB may include the control register block 210, the timing generator 220, the row driver 230, the CDS block 240, the comparator block 250, the ADC block 260, the ramp signal generator 270, or the buffer 280 in FIG. 3.

The pad region PR may include a plurality of pads PAD to exchange electrical signals with an external apparatus or a package base substrate. The pad region PR may be located around the sensor array region SAR. For example, the pads PAD in the pad region PR may be electrically connected to the unit pixels PX and located around the sensor array region SAR. Although the image sensor chip CHa according to the present embodiment includes the pad region PR, the image sensor chip CHa may not include the pad region PR in another embodiment. Instead, pads or connectors may be located under the sensor array region SAR or the logic region LR.

The pads PAD may include, for example, a metal, a metal nitride, or a combination thereof. A conductive interconnection and a conductive plug may be formed on the semiconductor substrate SUB and may electrically connect the pads PAD with the electronic devices in the logic region LR and the unit pixels PX in the sensor array region SAR. The conductive interconnection and the conductive plug may include, for example, a metal, a metal nitride, or a combination thereof.

Figure 7:
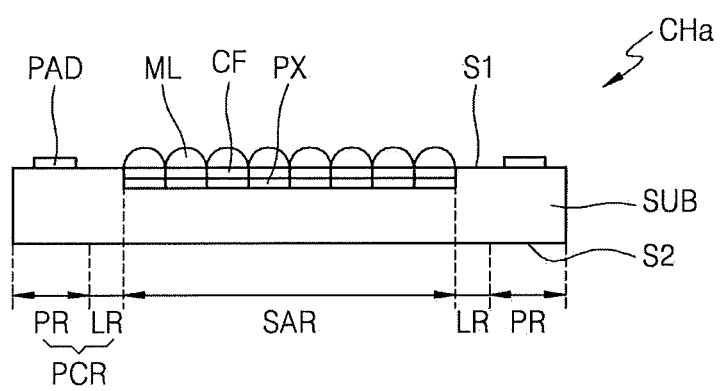
FIG. 7 illustrates a cross-sectional view of the image sensor chip.

FIG. 7 is a cross-sectional view of an embodiment of image sensor chip CHa including a sensor array region SAR, a logic region LR, and a pad region PR, which, for example, may be formed on a semiconductor substrate SUB. The semiconductor substrate SUB may have a first surface S1 and a second surface S2 which are opposite to each other. The first surface S1 and the second surface S2 of the semiconductor substrate SUB may also be respectively referred to as a top surface and a bottom surface of the semiconductor substrate SUB.

The sensor array region SAR may include a plurality of unit pixels PX arranged in a matrix shape. The unit pixels PX and the pads PAD may be formed on the first surface S1 of the semiconductor substrate SUB. A color filter layer CF and a microlens layer ML may be sequentially formed on the unit pixels PX.

A plurality of color filter layers CF may include, for example, a red (R) filter, a blue (B) filter, and a green (G) filter. Alternatively, the color filter layers CF may include a cyan (C) filter, a yellow (Y) filter, and a magenta (M) filter. One color filter layer CF of the R filter, the B filter, and the G filter or one color filter CF of the C filter, the Y filter, and the M filter may be formed on each unit pixel PX, so that each unit pixel PX senses an element of separated incident light and recognizes one color.

The microlens layers ML may condense incident light of the sensor array region SAR on the unit pixels PX. When each unit pixel PX includes a photodiode, the microlens layers ML may condense incident light of the sensor array region SAR on the photodiode of the unit pixel PX. The microlens layer ML may include, for example, a TMIR-based resin (e.g., available from Tokyo Ohka Kogyo, Co.) or an MFR-based resin (e.g., available from Japan Synthetic Rubber Corporation).

Figure 8:
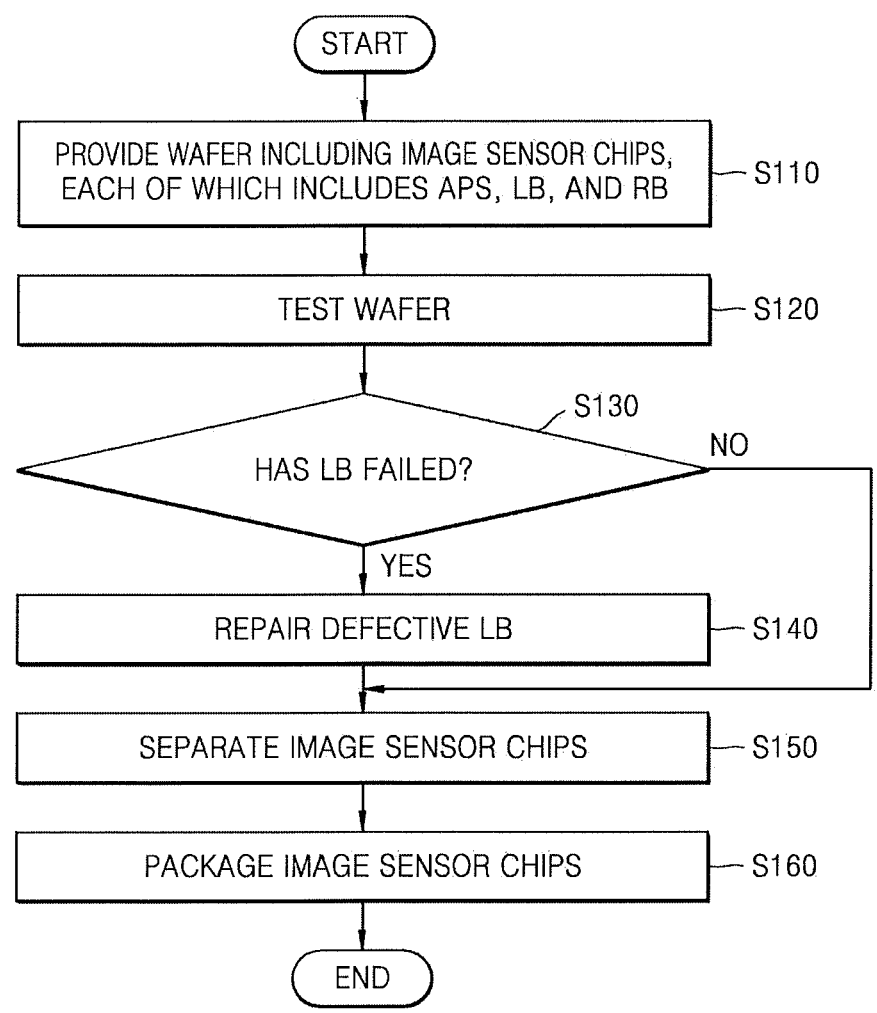
FIG. 8 illustrates an embodiment of a method for fabricating an image sensor chip package.

FIG. 8 illustrates an embodiment of a method for fabricating an image sensor chip package. Referring to FIG. 8, the method includes performing a test process on image sensor chips formed on a wafer and performing a repair operation on a defective block based on a test result. For example, the method may be a method of packaging the image sensor chip CH or CHa in FIGS. 5 to 7. This embodiment of the method for fabricating the image sensor chip package according to the present embodiment will be illustratively described in detail with reference to FIGS. 5 to 8.

In operation S110, a wafer WP is provided including image sensor chips CH or CHa, each of which includes an active pixel sensor APS, a logic block LB, and a redundancy block RB. Each image sensor chip CH or CHa may include a plurality of logic blocks LB and at least one redundancy block RB corresponding to at least one of the logic blocks LB.

In operation S120, the wafer WP may be tested. For example, the wafer WP may be tested using the pads PAD of each of the image sensor chips CHa. In an exemplary embodiment, by performing a test process using the pads PAD of each of the image sensor chip CHa, it may be determined whether or not the logic block LB is defective or whether or not the logic block LB has failed. For example, the test process may be performed by automatic test pattern generation (ATPG) or scan ATPG. Thus, it may be detected whether or not each of the logic blocks in each of the image sensor chip CHa is defective.

In an exemplary embodiment, by performing a test process using the pads PAD of each of the image sensor chips CHa, it may be determined whether or not a first redundancy block RB1 or a second redundancy block RB2 is defective or whether or not the first redundancy block RB1 or the second redundancy block RB2 has failed. For example, the test process may be performed by using ATPG or scan ATPG. Thus, it may be detected whether or not each of a plurality of redundancy blocks in each of the image sensor chips CHa is defective.

In operation S130, it may be determined whether or not the logic block LB has failed. If the determination result is that the logic block LB has failed, operation S140 may be performed. If the determination result is that the logic block LB has not failed, operation S150 may be performed. The failed logic block LB may be referred to as a defective logic block.

In an exemplary embodiment, it may be determined whether or not the redundancy block RB has failed instead of the logic block LB. If the determination result is that the redundancy block RB has failed, operation S140 may be performed. If the determination result is that the redundancy block RB has not failed, operation S150 may be performed.

In operation S140, a defective logic block may be repaired. For example, the defective logic block may be replaced by a redundancy block in the image sensor chip CH or CHa on the wafer WP. If testing the logic block LB indicates that the logic block LB is a defective block, the logic block LB may be replaced by the first redundancy block RB1. If testing the first redundancy block RB1 indicates that the first redundancy block RB1 is a defective block, the logic block LB and the first redundancy block RB1 may be replaced by the second redundancy block RB2.

In an exemplary embodiment, each logic block LB and the first and second redundancy blocks RB1 and RB2 may include an e-fuse connected to a power terminal thereof. Supplying power to a defective block detected in a test process may be interrupted by cutting the e-fuse connected to the defective block. In this case, power may be supplied to a corresponding redundancy block. For example, when the logic block LB is determined to be a defective block, supplying power to the logic block LB may be interrupted by cutting an e-fuse connected to the logic block LB, and power may be supplied to the first redundancy block RB1. Also, when the first redundancy block RB1 is determined to be a defective block, supplying of power to the first redundancy block RB may be interrupted by cutting an e-fuse connected to the first redundancy block RB1, and power may be supplied to the second redundancy block RB2.

In operation S150, image sensor chips may be separated from one another. For example, the wafer WP may be cut into discrete image sensor chips. In one embodiment, a sawing process may be performed along scribe lanes of the wafer WP to discretely separate the image sensor chips. The sawing process may be performed, for example, using a sawing wheel or a laser.

In operation S160, the image sensor chip may be packaged. In an exemplary embodiment, the image sensor chip may be mounted on a package substrate. The image sensor chip may be mounted on the package substrate using, for example, a flip-chip bonding process or a wire bonding process. The package substrate may be one of various kinds of substrates, for example, a printed circuit board (PCB), a flexible substrate, or a tape substrate. For example, the package substrate may be a flexible PCB, a rigid PCB, or a combination thereof in which internal interconnections are formed.

In some embodiments, the method for fabricating an image sensor chip package may further include performing a secondary test process on the discrete image sensor chips to determine whether or not the logic block LB is a defective block. The method may also include replacing the logic block LB by the first redundancy block RB if the secondary testing indicates that the logic block LB is a defective block.

Figure 9:
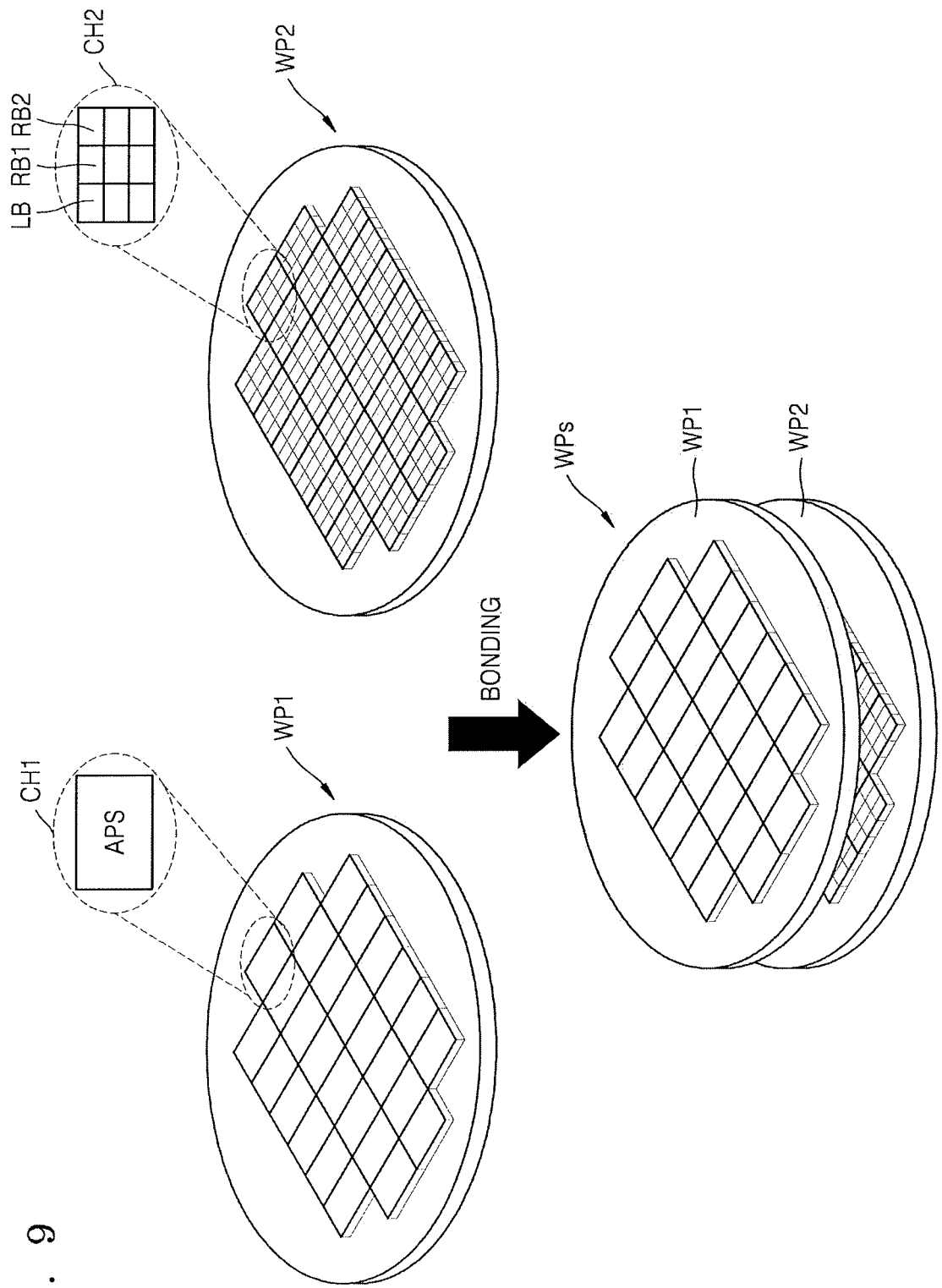
FIG. 9 illustrates an embodiment of a stack structure of wafers.

FIG. 9 illustrates an embodiment of a stack structure of two wafers WP1 and WP2. Referring to FIG. 9, a plurality of upper semiconductor chips CH1 may be arranged in a two-dimensional pattern on a surface of a first wafer WP1. Each upper semiconductor chip CH1 may include an active pixel sensor APS, which may correspond to a pixel array, e.g., the pixel array 100 in FIG. 2.

A plurality of lower semiconductor chips CH2 may be arranged in a two-dimensional pattern on a surface of a second wafer WP2. Each lower semiconductor chip CH2 may include a logic block LB and first and second redundancy blocks RB1 and RB2. The logic block LB and the first and second redundancy blocks RB1 and RB2 may correspond to a peripheral circuit unit, e.g., the peripheral circuit unit 200 in FIG. 2.

The first wafer WP1 on which the upper semiconductor chips CH1 are arranged and the second wafer WP2 on which the lower semiconductor chips CH2 are arranged may be stacked and bonded to each other, to thereby form a stacked wafer structure WPs. For example, the first and second wafers WP1 and WP2 may be adhered to each other using an adhesive layer. The adhesive layer may include an insulating adhesive material, for example, an epoxy resin or a silicone resin. Thus, according to the present embodiment, each of the upper semiconductor chips CH1 may include the pixel array, and each of the lower semiconductor chips CH2 may include the peripheral circuit unit. Accordingly, the pixel array and the peripheral circuit unit may be formed by two wafers WP1 and WP2.

In the stacked wafer structure WPs, if at least one of a plurality of logic blocks on the lower semiconductor chip CH2 has failed, a stacked image sensor chip corresponding to the failed logic block may fail. Accordingly, the active pixel sensor APS on a normal upper semiconductor chip CH1 also may not be used. This reduces the production yield during mass production of stacked image sensor chips.

Figure 10A:
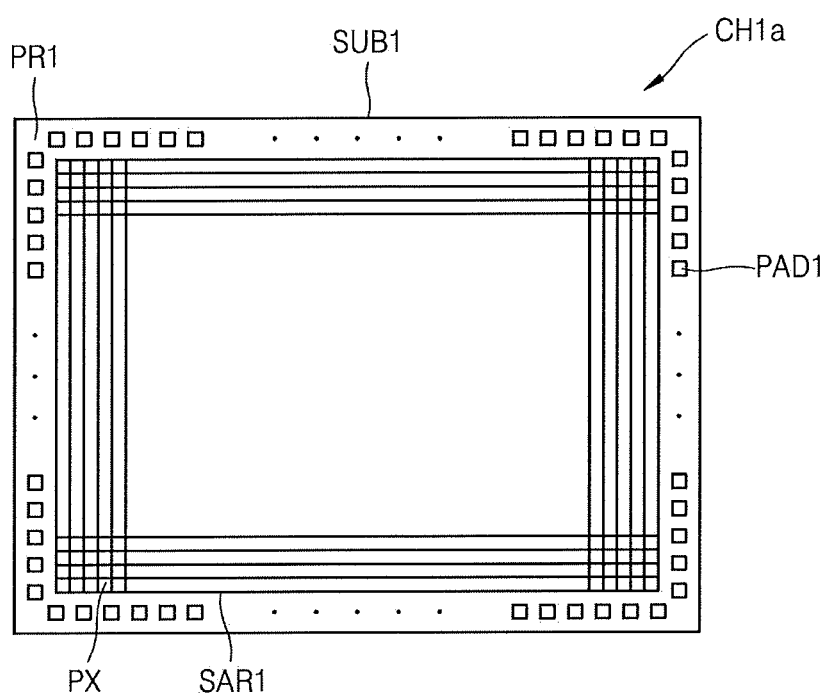
FIG. 10A illustrates an embodiment of an upper semiconductor chip.
Figure 10B:
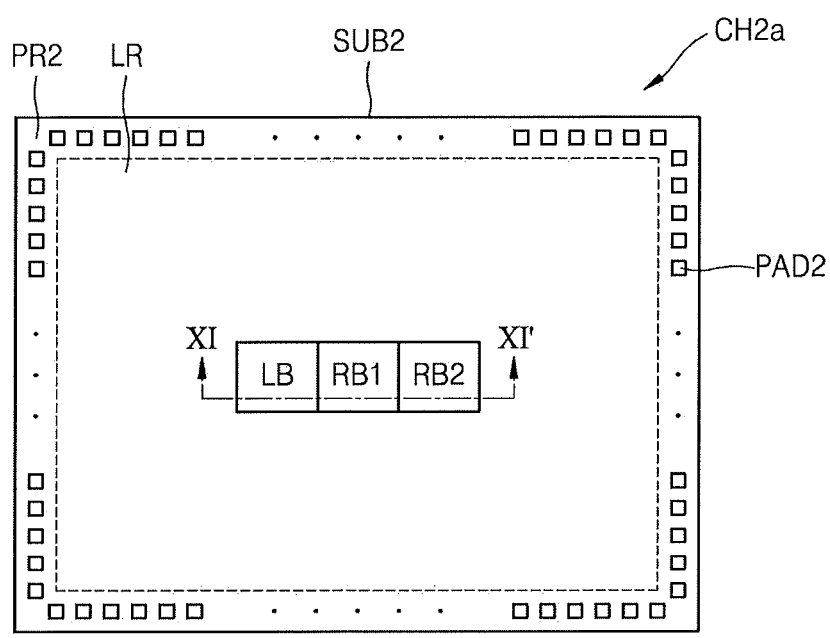
FIG. 10B illustrates an embodiment of a lower semiconductor chip.

FIG. 10A is a plan view of an embodiment of an upper semiconductor chip CH1a, FIG. 10B is a plan view of an embodiment of a lower semiconductor chip CH2a. Referring to FIG. 10A, the upper semiconductor chip CH1a may include a sensor array region SAR1 and a pad region PR1 on a semiconductor substrate SUB1. The upper semiconductor chip CH1a may be an example of the upper semiconductor chip CH1 in FIG. 9. The semiconductor substrate SUB1 may be substantially similar to the semiconductor substrate SUB in FIG. 6. Also, the pads PAD1 may be substantially similar to the pads PAD in FIG. 6.

The sensor array region SAR1 may include a plurality of unit pixels PX arranged in a matrix shape. The pad region PR1 may be located along an edge of the sensor array region SAR1. FIG. 10A illustrates a case in which the pad region PR1 is located along all four edges of the sensor array region SAR1. In other exemplary embodiments, the pad region PR1 may be located along a different number (e.g., two or three) of edges of the sensor array region SAR1. The pad region PR1 may include a plurality of pads PAD1 to exchange electric signals with the lower semiconductor chip CH2a.

Referring to FIG. 10B, a lower semiconductor chip CH2a may include a logic region LR1 and a pad region PR2 on a semiconductor substrate SUB2. The lower semiconductor chip CH2a may be an example of the lower semiconductor chip CH2 in FIG. 9. The semiconductor substrate SUB2 may be substantially similar to the semiconductor substrate SUB in FIG. 6. The pads PAD2 may be substantially similar to the pads PAD in FIG. 6.

The logic region LR1 may include electronic devices including a plurality of transistors and provide a predetermined signal to each of the unit pixels PX of the sensor array region SAR1 or control an output signal. According to the present embodiment, a logic block LB and first and second redundancy blocks RB1 and RB2 may be located in the logic region LR1. In the present embodiment, the logic block LB may be the control register block 210, the timing generator 220, the row driver 230, the CDS block 240, the comparator block 250, the ADC block 260, the ramp signal generator 270, or the buffer 280 in FIG. 3.

According to the present embodiment, the upper semiconductor chip CH1a and the lower semiconductor chip CH2a may be stacked and bonded to each other and constitute a stacked image sensor chip. Thus, the stacked image sensor chip may have about twice a usable area of the image sensor chip CHa in FIG. 6. Accordingly, resolution of the stacked image sensor chip may be improved by downscaling the stacked image sensor chip or increasing the number of pixels of the stacked image sensor chip. Also, a spare space may be secured in which a plurality of redundancy blocks, respectively corresponding to a plurality of logic blocks in the lower semiconductor chip CH2a, may be located.

Figure 11:
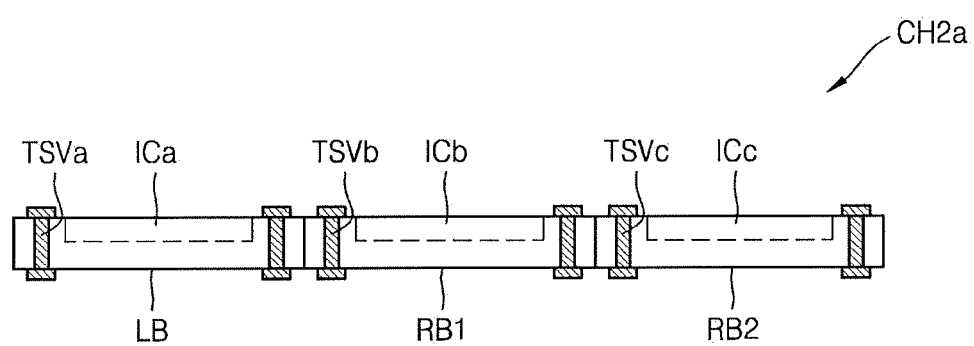
FIG. 11 illustrates a cross-sectional view of the lower semiconductor chip.

FIG. 11 illustrates an embodiment of a region of a lower semiconductor chip CH2a taken along section line XI-XI' in FIG. 10B. Referring to FIG. 11, the lower semiconductor chip CH2a may include a logic block LB and first and second redundancy blocks RB1 and RB2.

The logic block LB may include an IC ICa formed on a semiconductor substrate SUB2 and through-silicon vias (TSVs) formed through the semiconductor substrate SUB2 and electrically connected to an external circuit. In some embodiments, the TSVs TSVa may be located in an edge of the logic block LB. In some embodiments, the TSVs TSVa may be located in a central portion of the logic block LB.

The first redundancy block RB1 may be a redundancy block, which may correspond to the logic block LB and may be located adjacent to the logic block LB. The first redundancy block RB1 may be substantially similar to that of the logic block LB. For example, the first redundancy block RB1 may include an IC ICb formed on the semiconductor substrate SUB2 and TSVs TSVb formed through the semiconductor substrate SUB2 and electrically connected to an external circuit. In some embodiments, the TSVs TSVb may be located in an edge of the first redundancy block RB1. In some embodiments, the TSVs TSVb may be located in a central portion of the first redundancy block RB1.

The second redundancy block RB2 may be a redundancy block, which may correspond to the logic block LB and may be located adjacent to the first redundancy block RB1. The second redundancy block RB2 may be substantially similar to those of the logic block LB and the first redundancy block RB1. For example, the second redundancy block RB2 may include an IC or ICs formed on the semiconductor substrate SUB2 and electrically connected to an external circuit. In some embodiments, the TSVs TSVc may be located in an edge of the second redundancy block RB2. In some embodiments, the TSVs TSVc may be located in a central portion of the second redundancy block RB2.

Each logic block LB and the first and second redundancy blocks RB1 and RB2 may include an e-fuse or a one-time programmable (OTP) memory for performing a program operation using an electrical method. If a defective block occurs, the defective block may therefore be repaired.

In an exemplary embodiment, the e-fuse may be connected to a power terminal in the corresponding logic block LB and the first and second redundancy blocks RB1 and RB2. Cutting the e-fuse corresponding to a defective block detected in a process for testing the lower semiconductor chip CH2a interrupts supply of power to the defective block, and power may be supplied to a redundancy block.

Figure 12:
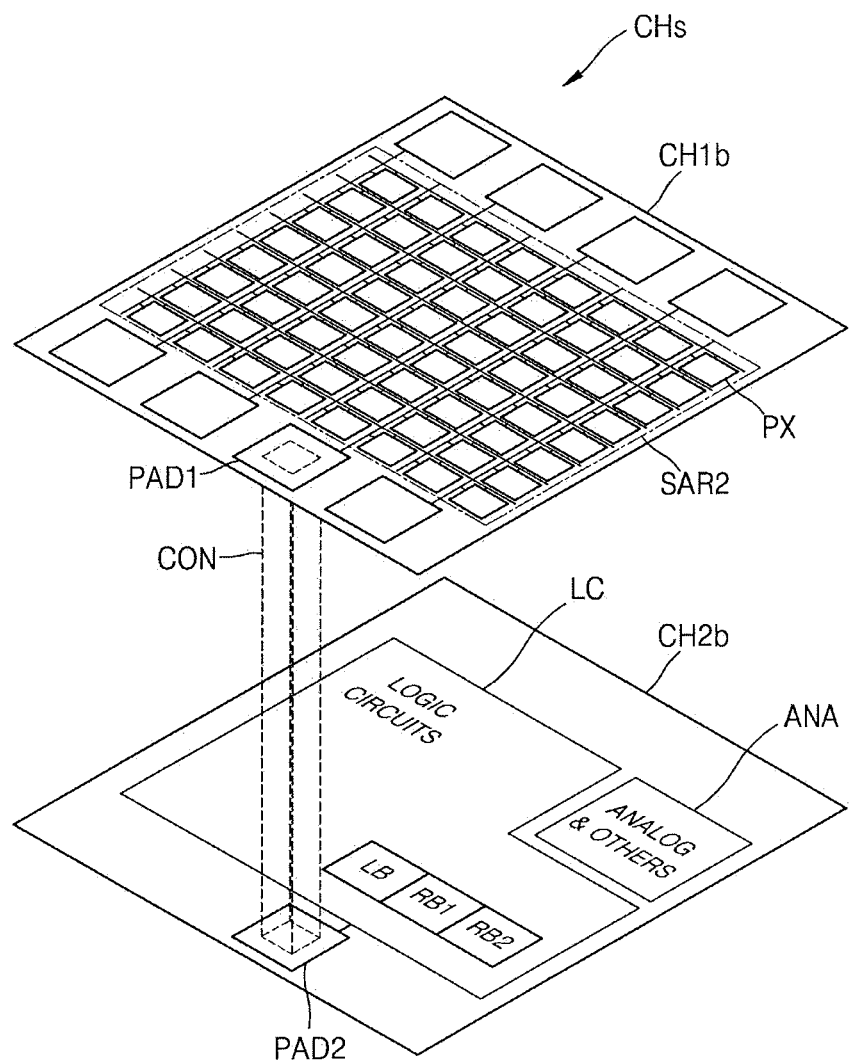
FIG. 12 illustrates an embodiment of a stacked image sensor chip.

FIG. 12 is a circuit diagram of an embodiment of a stacked image sensor chip CHs. Referring to FIG. 12, the stacked image sensor chip CHs may include an upper semiconductor chip CH1b and a lower semiconductor chip CH2b. The upper semiconductor chip CH1b may include a sensor array region SAR2, in which a plurality of unit pixels PX are arranged. The lower semiconductor chip CH2b may include a logic circuit unit LC and an analog circuit unit ANA. The logic circuit unit LC and the analog circuit unit ANA may correspond to a peripheral circuit unit, e.g., the peripheral circuit unit 200 in FIG. 2.

According to the present embodiment, the upper semiconductor chip CH1b and the lower semiconductor chip CH2b may be stacked and bonded to each other by an interconnection member CON, to thereby form a stacked image sensor chip CHs. The interconnection member CON may include a conductive material. For example, the interconnection member CON may include a through-silicon via (TSV), a back-via stack (BVS), and/or copper-to-copper (C2C).

When the upper semiconductor chip CH1b has substantially the same size as the image sensor chip CHa (e.g., in FIG. 6), the sensor array region SAR2 in the upper semiconductor chip CH1b may be larger than the sensor array region SAR in FIG. 6. Therefore, the number of pixels of the stacked image sensor chip CHs may increase, to thereby improve resolution of the stacked image sensor chip CHs. Also, since the lower semiconductor chip CH2b has substantially the same size as the image sensor chip CHa (e.g., in FIG. 6), the logic circuit unit LC in the lower semiconductor chip CH2b may be larger than the logic region LR in FIG. 6. Therefore, a plurality of redundancy blocks may be located in the logic circuit unit LC.

In the present embodiment, the logic circuit unit LC may include a logic block LB and first and second redundancy blocks RB1 and RB2. In the present embodiment, the logic block LB may be the control register block 210, the timing generator 220, the row driver 230, the CDS block 240, the comparator block 250, the ADC block 260, the ramp signal generator 270, or the buffer 280 in FIG. 3.

Figure 13:
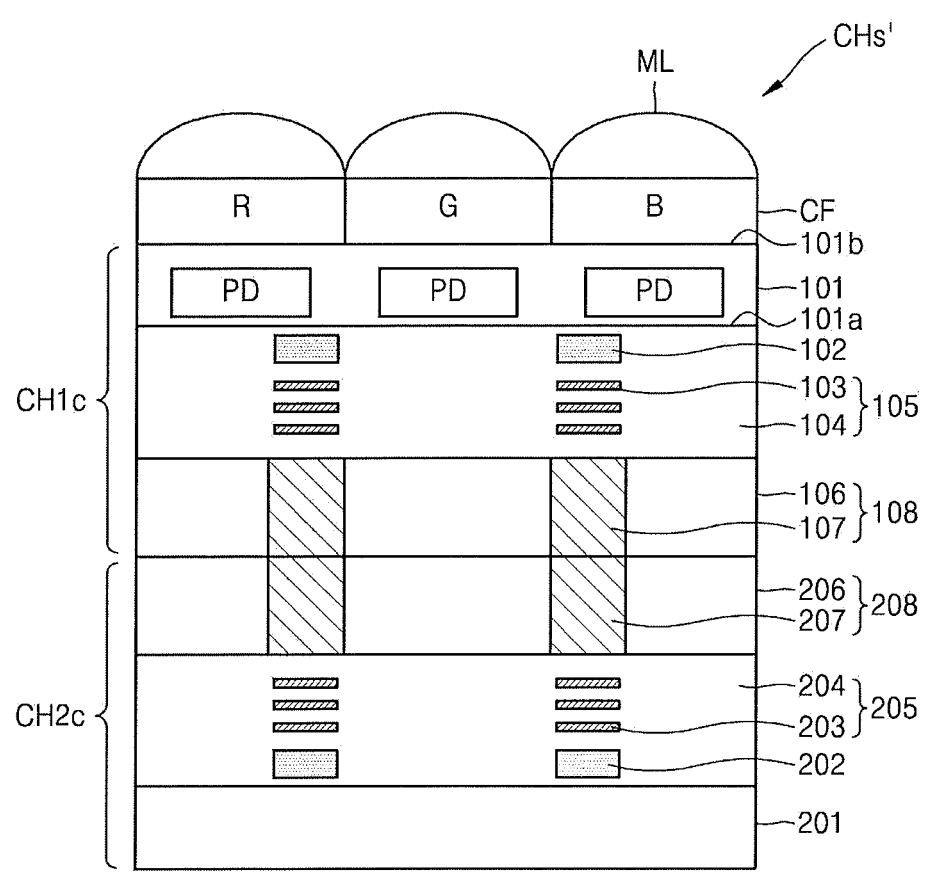
FIG. 13 illustrates an embodiment of a stacked image sensor.

FIG. 13 is a cross-sectional view of an embodiment of part of a stacked image sensor chip CHs'. Referring to FIG. 13, a stacked image sensor ISs may include an upper semiconductor chip CH1c formed on a first wafer (e.g., the first wafer WP1 in FIG. 9), a lower semiconductor chip CH2c formed on a second wafer (e.g., the second wafer WP2 in FIG. 9), a plurality of color filter layers CF, and a plurality of microlens layers ML. The color filter layers CF and the ML layer may be, for example, substantially similar to the color filter layers CF and the microlens layer ML in FIG. 7.

The upper semiconductor chip CH1c may include a first semiconductor layer 101, first gate electrodes 102, first metal interconnections 103, a first interlayer insulating layer 104, and a first electrode layer 108. The first semiconductor layer 101 may include a second surface 101b opposite to a first surface 101a. The first semiconductor layer 101 may include, for example, a silicon substrate. The first surface 101a may be a front surface of the silicon substrate. The second surface 101b may be a rear surface of the silicon substrate. In an exemplary embodiment, the first semiconductor layer 101 may be an epitaxial layer formed on the silicon substrate. In an exemplary embodiment, the first semiconductor layer 101 may be a thinned layer of a semiconductor substrate, such as a single crystalline silicon substrate.

Photodiodes PD and impurity regions used as source and drain regions may be formed in the first semiconductor layer 101. First gate electrodes 102 may be located on the first surface 101a of the first semiconductor layer 101. Thus, for example, unit pixels PXa, PXb, or PXc in FIG. 4A to 4C may be formed on the first semiconductor layer 101. In some embodiments, the photodiodes PD may have a multilayered structure on the first semiconductor layer 101.

A color filter layer CF and a microlens layer ML may be sequentially stacked on the second surface 101b of the first semiconductor layer 101. In some embodiments, a protection layer may be located on the second surface 101b of the first semiconductor layer 101, and the color filter layer CF may be located on the protection layer. The protection layer may include a material layer having passivation characteristics. For example, the protection layer may include a silicon oxide layer, a silicon nitride layer, or a silicon oxynitride layer.

A multilayered interconnection structure 105 may include a first interlayer insulating layer 104 and first metal interconnections 103. The first interlayer insulating layer 104 may cover the first surface 101a of the first semiconductor layer 101. At least portions of the first metal interconnections 103 may be insulated by the first interlayer insulating layer 104. The first metal interconnections 103 may be used as electrical interconnections required for sensing operations of unit pixels on the first semiconductor layer 101. In an exemplary embodiment, the first metal interconnections 103 may include copper, aluminum, titanium, or titanium nitride. FIG. 13 illustrates a case in which the first metal interconnections 103 have two layers. In another embodiment, a different number of first metal interconnections 103 may be included, e.g., a larger number of layers than two or a single layer.

In an exemplary embodiment, the first interlayer insulating layer 104 may include an oxide layer or a composite layer of an oxide layer and a nitride layer. For example, the oxide layer may be a silicon oxide layer. In an exemplary embodiment, the interlayer insulating layer 104 may include at least one of flowable oxide (FOX), high-density plasma (HDP) oxide, tonen silazene (TOSZ), spin on glass (SOG), or undoped silica glass (USG).

In addition, the first electrode layer 108 may be located on the multilayered interconnection structure 105 and may include a first bonding insulating layer 106 and first electrodes 107. The first electrodes 107 may be located to electrically connect the upper semiconductor chip CH1c and the lower semiconductor chip CH2c. The first electrodes 107 may include the same material as the first metal interconnections 103. The first bonding insulating layer 106 may insulate the first electrodes 107 from one another and be located on the first interlayer insulating layer 104 to coat circumferences of the first electrodes 107. In this case, the first bonding insulating layer 106 may prevent diffusion of a metal material in the first electrode 107. The first bonding insulating layer 106 may constitute a bonding surface between the upper semiconductor chip CH1c and the lower semiconductor chip CH2c.

The lower semiconductor chip CH2c may include a second semiconductor layer 201, second gate electrodes 202, second metal interconnections 203, a second interlayer insulating layer 204, and a second electrode layer 208. In an exemplary embodiment, the second semiconductor layer 201 may be an epitaxial layer formed on a silicon substrate. In an exemplary embodiment, the second semiconductor layer 201 may be a thinned layer of a semiconductor substrate, such as a single crystalline silicon substrate.

Impurity regions corresponding to source and drain regions may be formed in the second semiconductor layer 201. The second gate electrodes 202 may be located on a first surface 201a of the second semiconductor layer 201. Thus, for example, the peripheral circuit unit 200 in FIG. 2 may be formed on the second semiconductor layer 201. For example, a logic block LB and a redundancy block RB corresponding to the logic block LB may be formed on the second semiconductor layer 201. The logic block LB may be, for example, the control register block 210, the timing generator 220, the row driver 230, the CDS block 240, the comparator block 250, the ADC block 260, the ramp signal generator 270, or the buffer 280 in FIG. 3.

A multilayered interconnection structure 205 may include a second interlayer insulating layer 204 and second metal interconnections 203. The second interlayer insulating layer 204 may cover the first surface 201a of the second semiconductor layer 201. At least portions of the second metal interconnections 203 may be insulated by the second interlayer insulating layer 204. The second metal interconnections 203 may be used as electrical interconnections for driving logic circuits on the second semiconductor layer 201. In an exemplary embodiment, the second metal interconnections 203 may include for example, copper, aluminum, titanium, or titanium nitride. FIG. 13 illustrates a case in which the second metal interconnections 203 have two layers. In another embodiment, a different number of second metal interconnections 203 may be included, e.g., greater than two layers or a single layer. The second interlayer insulating layer 204 may be substantially similar to the first interlayer insulating layer 104.

In addition, the second electrode layer 208 may be located on the multilayered interconnection structure 205. The second electrode layer 208 may include a second bonding insulating layer 206 and second electrodes 207. The second electrodes 207 may be located to electrically connect the upper semiconductor chip CH1c and the lower semiconductor chip CH2c and may include the same material as the second metal interconnections 203. The second bonding insulating layer 206 may insulate the second electrodes 207 from one another and coat circumferences of the second electrodes 207 on the second interlayer insulating layer 204. The second bonding insulating layer 206 may prevent diffusion of a metal material in the second electrodes 207. The second bonding insulating layer 206 may constitute a bonding surface between the upper semiconductor chip CH1c and the lower semiconductor chip CH2c.

As described above, in the stacked image sensor ISs according to the present embodiment, the upper semiconductor chip CH1c and the lower semiconductor chip CH2c may be stacked and bonded to each other using the first and second bonding insulating layers 106 and 206 and the first and second electrodes 107 and 207 as the bonding surfaces. The first and second electrodes 107 and 207 may constitute a C2C connection structure. Thus, the stacked image sensor ISs may reduce a resistance capacitance (RC) delay and reduce the size of the stacked image sensor ISs.

Figure 14:
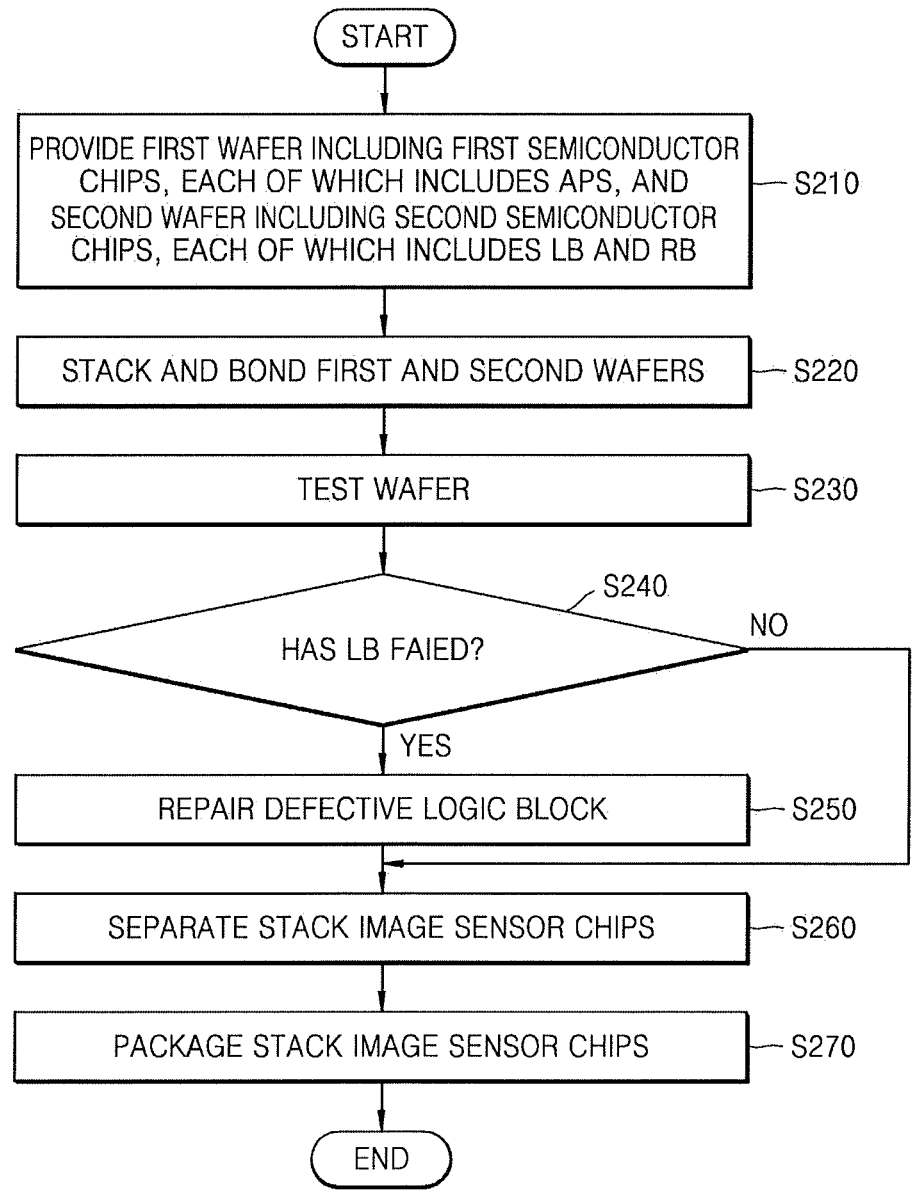
FIG. 14 illustrates an embodiment of a method for fabricating a stacked image sensor chip package.

FIG. 14 illustrates an embodiment of a method for fabricating a stacked image sensor chip package. Referring to FIG. 14, the method includes performing a test process on stacked image sensor chips formed by stacking wafers and performing a repair operation on a defective block based on a test result. The method may be, for example, a method for packaging the stacked image sensor chip CHs or the stacked image sensor ISs in FIGS. 9 to 13.

In operation S210, a first wafer WP1 may be provided having upper semiconductor chips CH1, CH1a, CH1b, or CH1c, each of which includes an active pixel sensor APS, and a second wafer WP2 having lower semiconductor chips CH2, CH2a, CH2b, or CH2c, each of which includes an logic block LB and a redundancy block RB. Each of the lower semiconductor chips CH2, CH2a, CH2b, or CH2c may include a plurality of logic blocks LB and at least one redundancy block RB corresponding to at least one of the logic blocks LB.

In operation S220, the first and second wafers WP1 and WP2 may be stacked and bonded to each other. In an exemplary embodiment, the first wafer WP1 and the second wafer WP2 may be stacked and bonded to each other by an interconnection member, to thereby form a stacked wafer structure WPs. In an exemplary embodiment, the interconnection member may include a conductive material and include, for example, a TSV, a BVS, and/or a C2C.

In operation S230, the stacked wafer structure WPs may be tested. A plurality of stacked image sensor chips CHs may be located on the stacked wafer structure WPs. The stacked wafer structure WPs may be tested, for example, using pads PAD of each of the stacked image sensor chips CHs. In an exemplary embodiment, by performing a test process using the pads PAD of each of the stacked image sensor chips CHs, it may be determined whether or not the logic block LB, a first redundancy block RB1, or a second redundancy block RB2 is defective or whether or not the logic block LB, the first redundancy block RB1, or the second redundancy block RB2 has failed. The test process may be performed, for example, using ATPG or scan ATPG. Thus, it may be detected whether or not each of a plurality of logic blocks LB in each of the stacked image sensor chips CHs is defective.

In operation S240, it may be determined whether the logic block LB has failed. If the determination result is that logic block LB has failed, operation S250 may be performed. If the determination result is that the logic block LB has not failed, operation S260 may be performed. In this case, the failed logic block LB may be referred to as a defective logic block. In an exemplary embodiment, it may be determined whether or not the redundancy block RB has failed instead of the logic block LB. If the determination result is that the redundancy block RB has failed, operation S250 may be performed. If the determination result is that the redundancy block RB has not failed, operation S260 may be performed.

In operation S250, the defective logic block may be repaired. For example, the defective logic block may be replaced by a redundancy block in the stacked image sensor chip CHs formed on the stacked wafer structure WPs. If testing the logic block LB indicates that the logic block LB is a defective block, the logic block LB may be replaced by the first redundancy block RB1. If testing indicates that the first redundancy RB1 is a defective block, the logic block LB and the first redundancy block RB1 may be replaced by the second redundancy block RB2.

In an exemplary embodiment, each of the logic block LB and the first and second redundancy blocks RB1 and RB2 may include an e-fuse connected to a power terminal thereof. Supplying power to the defective block may be interrupted by cutting the e-fuse connected to the corresponding defective block detected in a test process, and power may be supplied to the redundancy block. For example, when the logic block LB is a defective block, the supplying of power to the logic block LB may be interrupted by cutting an e-fuse connected to the logic block LB, and power may be supplied to the first redundancy block RB1. Also, when the first redundancy block RB1 is also a defective block, supply of power to the first redundancy block RB1 may be interrupted by cutting an e-fuse connected to the first redundancy block RB1, and power may be supplied to the second redundancy block RB2.

In operation S260, stacked image sensor chips may be separated from one another. For example, the stacked wafer structure WPs may be cut into discrete stacked image sensor chips. In one embodiment, a sawing process may be performed along scribe lanes of the stacked wafer structure WPs to discretely separate the stacked image sensor chips. The sawing process may be performed, for example, using a sawing wheel or a laser.

In operation S270, the stacked image sensor chip may be packaged. In an exemplary embodiment, the stacked image sensor chip may be mounted on a package substrate. The stacked image sensor chip may be mounted on the package substrate using, for example, a flip-chip bonding process or a wire bonding process. The package substrate may be, for example, a printed circuit board (PCB), a flexible substrate, or a tape substrate. For example, the package substrate may be a flexible PCB, a rigid PCB, or a combination thereof in which internal interconnections are formed.

In some embodiments, the method of fabricating the stacked image sensor chip package may further include performing a secondary test process on the discrete stacked image sensor chips to determine whether or not the logic block LB is a defective block. Also, the method may include replacing the logic block LB by the first redundancy block RB1 if the secondary testing indicates that the logic block LB is a defective block.

In some embodiments, the first wafer WP1 may be cut into discrete first semiconductor chips, the separated first semiconductor chips may be stacked on the second wafer WP2, and a test process may be performed. In some embodiments, the second wafer WP2 on which the first semiconductor chips are stacked may be cut into discrete stacked semiconductor chips and a test process may be performed.

Figure 15:
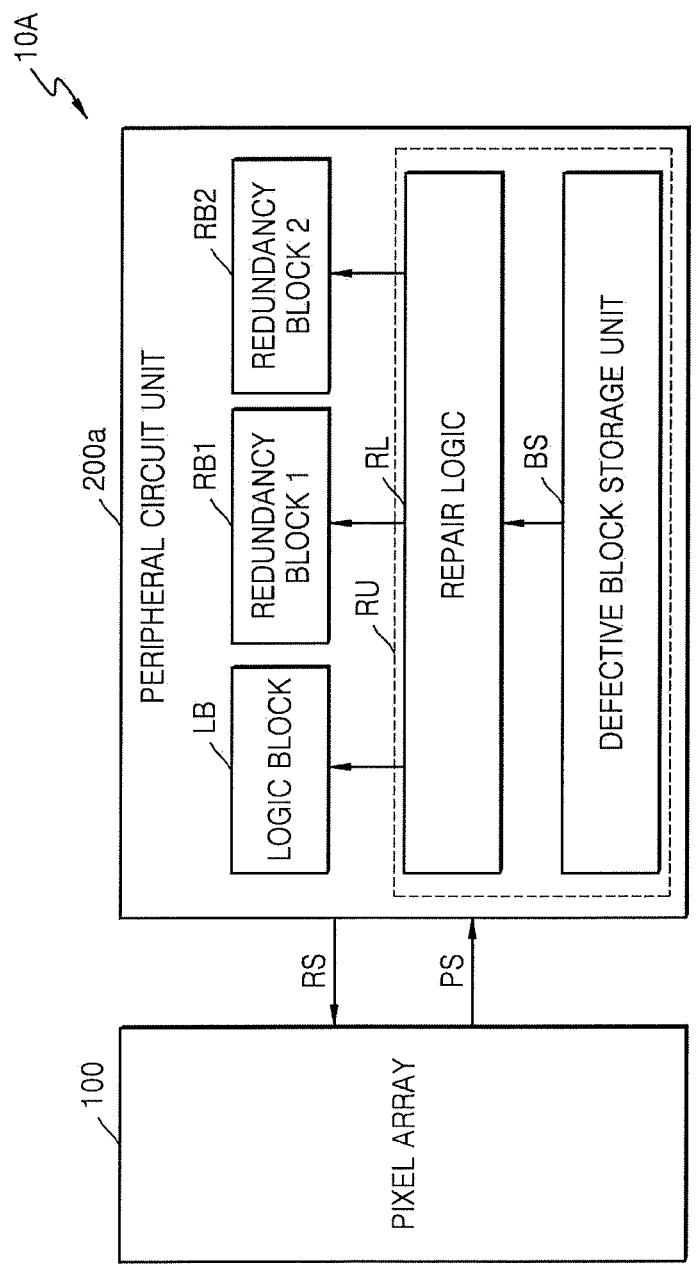
FIG. 15 illustrates an embodiment of an image sensor.

FIG. 15 illustrates an embodiment of image sensor 10A which includes a pixel array 100 and a peripheral circuit unit 200a. The peripheral circuit unit 200a may include a logic block LB, first and second redundancy blocks RB1 and RB2, and a repair unit RU. The repair unit RU may include a repair logic RL and a defective block storage unit BS. The pixel array 100 and the peripheral circuit unit 200a according to the present embodiment may respectively correspond to the pixel array 100 and the peripheral circuit unit 200 in FIG. 2. Differences between the image sensor 10A according to the present embodiment and the image sensor 10 of FIG. 2 will mainly be described.

The defective block storage unit BS may store defective block information indicating results generated by testing the logic block LB or the first and second redundancy blocks RB1 and RB2. The defective block information may indicate, for example, a block (e.g., a defective block) determined to have failed based on a test result. In an exemplary embodiment, the defective block storage unit BS may store defective block information obtained based on a test result obtained on a wafer level. In an exemplary embodiment, the defective block storage unit BS may store defective block information obtained based on results of the testing of a discrete image sensor chip or a stacked image sensor chip after a sawing process.

The repair logic RL may select one of the logic block LB and the first and second redundancy blocks RB1 and RB2 based on the defective block information. For example, when the logic block LB is a defective block, the repair logic RL may interrupt electrical connection to the logic block LB to disable the logic block LB, and may provide electrical connection to the first redundancy block RB1 to enable the first redundancy block RB1. When the first redundancy block RB1 is a defective block, the repair logic RL may interrupt electrical connection of the first redundancy block RB1 to disable the first redundancy block RB1 and may provide electrical connection to the second redundancy block RB2 to enable the second redundancy block RB2.

Figure 16:
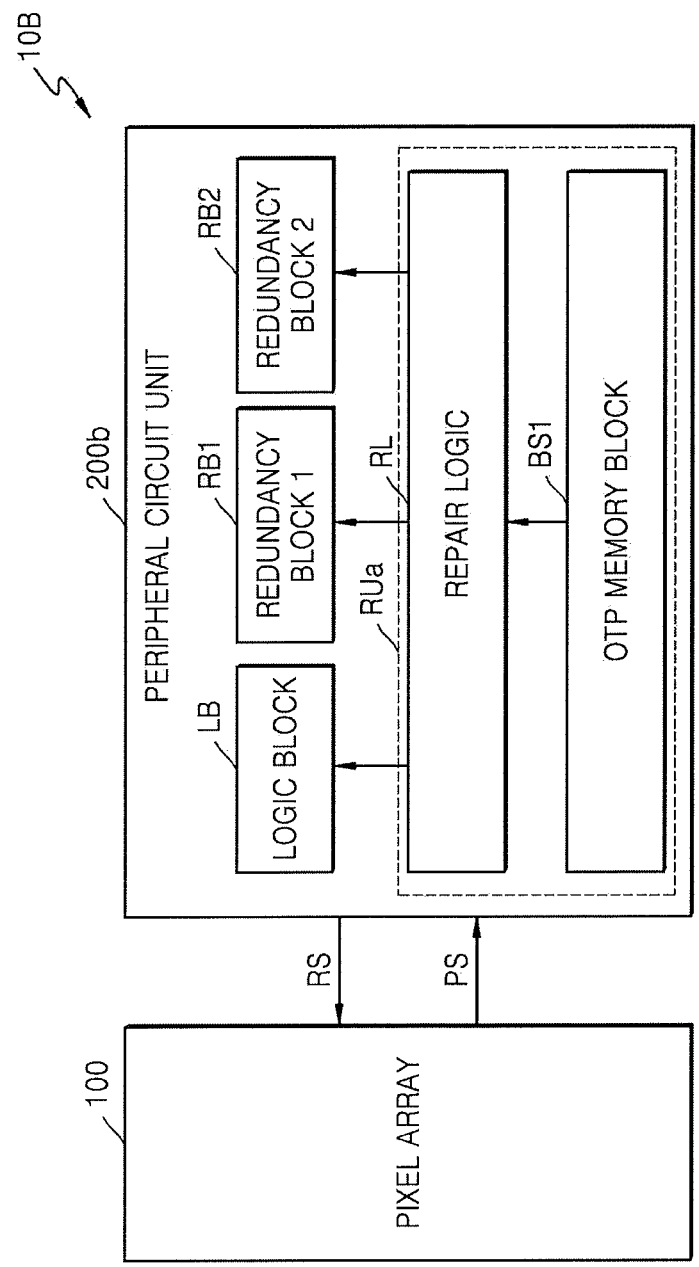
FIG. 16 illustrates another embodiment of an image sensor.

FIG. 16 illustrates an embodiment of image sensor 10B which includes a pixel array 100 and a peripheral circuit unit 200b. The peripheral circuit unit 200b may include a logic block LB, first and second redundancy blocks RB1 and RB2, and a repair unit RUa. The repair unit RUa may include a repair logic RL and an OTP memory block BS1. The image sensor 10B may be a modified example of image sensor 10A in FIG. 15 and may include an OTP memory block BS1 as an example of the defective block storage unit BS of FIG. 15.

The OTP memory block BS1 may include a plurality of OTP memory cells and control the repair logic RL to select one of the logic block LB and the first and second redundancy blocks RB1 and RB2 in response to indicator data stored in the OTP memory cells. The repair logic RL may select one of the logic block LB and the first and second redundancy blocks RB1 and RB2 based on indicator data stored in the OTP memory block BS1. In an exemplary embodiment, the repair logic RL may include, for example, a multiplexer.

The OTP memory cells may be non-volatile memory cells for permanently retaining programmed data even when power is not supplied. Due to these characteristics, the OTP memory cells may be used to repair the logic LB in the image sensor 10B. For example, the logic block LB may be tested, and characteristics of the logic block LB based on test results may be stored in the OTP memory block BS1 of the image sensor 10B. The image sensor 10B may operate based on information stored in the OTP memory cells to prevent malfunctions in the image sensor 10B. Since the OTP memory cells are advantageous in terms of fabrication easiness and security, the OTP memory cells may be used for system-on chips (SoCs) instead of e-fuses.

In an exemplary embodiment, the number of OTP memory cells may be adaptively determined by the number of logic blocks LB and the redundancy blocks RB1 and RB2. When the number of logic blocks LB and redundancy blocks RB1 and RB2 is three, the OTP memory block BS1 may include two OTP memory cells. For example, indicator data corresponding to the logic block LB may be '00', indicator data corresponding to the first redundancy block RB1 may be '01', and indicator data corresponding to the second redundancy block RB2 may be '10'.

If the test result indicates that the logic block LB is not a defective block, the OTP memory block BS1 may store indicator data '00', and the repair logic RL may select the logic block LB based on the indicator data. If the test result indicates that the logic block LB is a defective block, the OTP memory block BS1 may store indicator data '01', and the repair logic RL may select the first redundancy block RB1 based on the indicator data. If the test result indicates that the first redundancy block RB1 is a defective block, the OTP memory block BS1 may store indicator data '10', and the repair logic RL may select the second redundancy block RB2.

Figure 17:
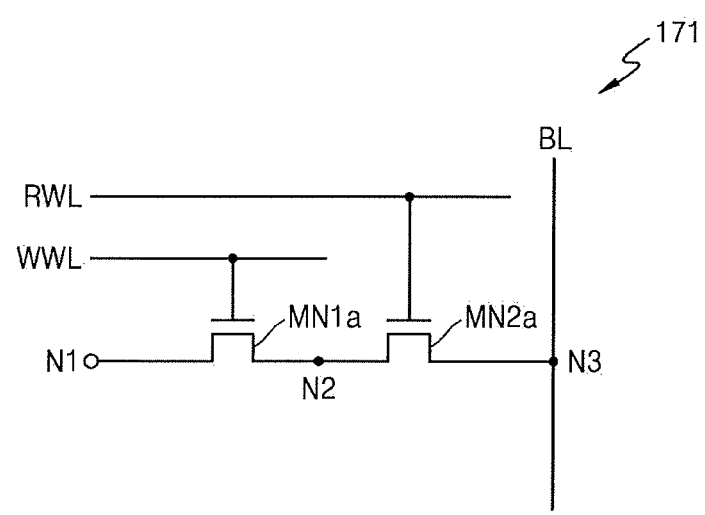
FIG. 17 illustrates an embodiment of a one-time programmable (OTP) memory cell.

FIG. 17 illustrates an embodiment of OTP memory cell 171 included in the OTP memory block BS1 of FIG. 16. The OTP memory cell 171 may include a write transistor MN 1a and a read transistor MN2a. A gate of the write transistor MN1a may be connected to a write word line WWL, a gate of the read transistor MN2a may be connected to a read word line RWL, and the write transistor MN1a and the read transistor MN2a may be connected in series.

Before a write operation is performed on the OTP memory cell 171, ends (e.g., first node N1 and second node N2) of the write transistor MN 1a may be in a non-conduction state. However, by performing the write operation on the OTP memory cell 171, a gate oxide layer of the write transistor MN1a may be broken down. Thus, both ends (first node N1 and second node N2) of the write transistor MN1a may be irreversibly changed from the non-conduction state into a conduction state.

Figure 18:
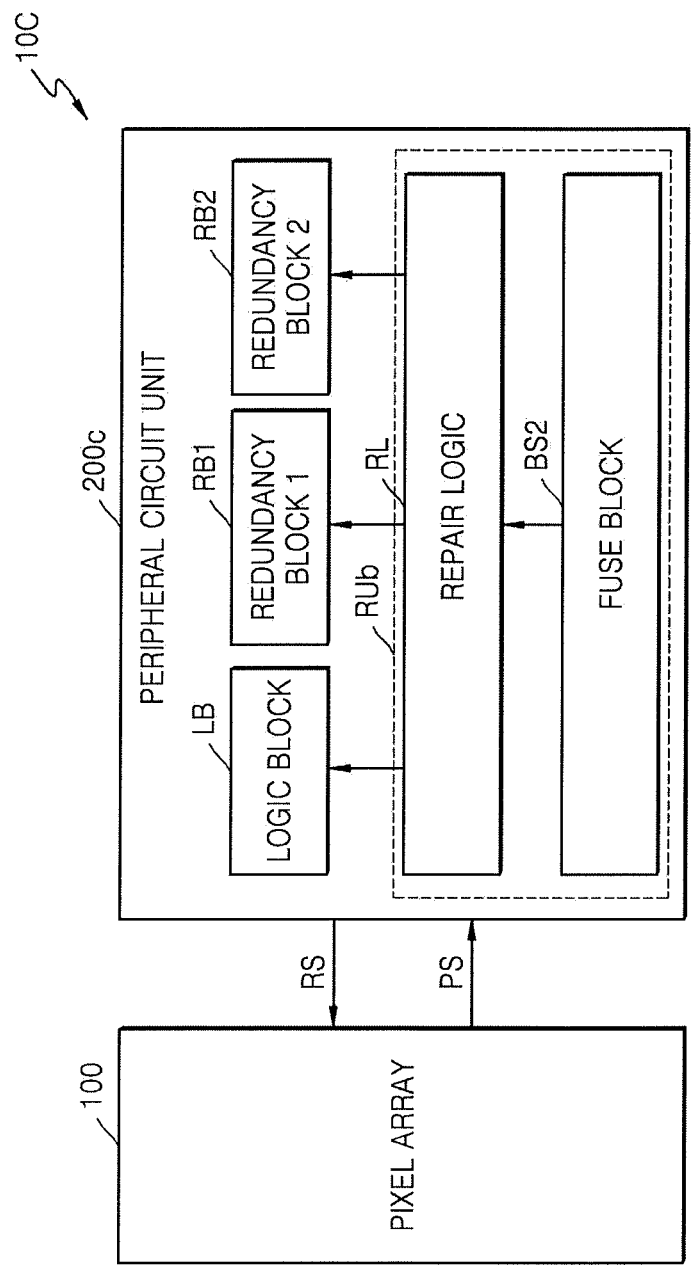
FIG. 18 illustrates another embodiment of an image sensor.

FIG. 18 illustrates an embodiment of an image sensor 10C which includes a pixel array 100 and a peripheral circuit unit 200c. The peripheral circuit unit 200c may include a logic block LB, first and second redundancy blocks RB1 and RB2, and a repair unit RUb. The repair unit RUb may include a repair logic RL and a fuse block BS2. The image sensor 10C may be a modified example of the image sensor 10A in FIG. 15 and may include a fuse block BS2 as an example of the defective block storage unit BS in FIG. 15.

The fuse block BS2 may include a plurality of fuse devices. Defective block information indicating a block to be repaired may be programmed in each of the fuse devices. The fuse block BS2 may provide a fuse signal corresponding to a connection state of each of the fuse devices in which the defective block information is programmed, and may control the repair logic RL to select one of the logic block LB and the first and second redundancy blocks RB1 and RB2. The repair logic RL may select one of the logic block LB or the first and second redundancy blocks RB1 and RB2 based on a fuse signal provided by the fuse block BS2. In an exemplary embodiment, the repair logic RL may include a multiplexer.

The fuse devices may permanently cut off connection of circuits when a rated current or voltage or higher is applied. Due to these characteristics, the fuse devices may be used to repair the logic block LB in the image sensor 10C. In an exemplary embodiment, the fuse devices may be e-fuses which cut off based on overcurrent. In an exemplary embodiment, the fuse devices may be anti-fuses which disconnect circuits in normal conditions and connect circuits due to a specific rated current. For example, an anti-fuse may break down a dielectric layer of a capacitor and form a current path in the dielectric layer of the capacitor.

Figure 19:
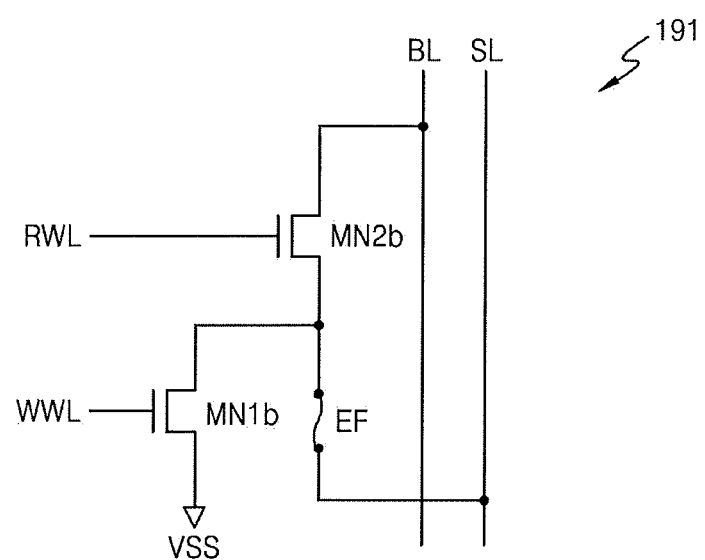
FIG. 19 illustrates an embodiment of a fuse device.

FIG. 19 illustrates an embodiment of a fuse device 191 which may be in the fuse block BS2 in FIG. 18. The fuse device 191 may include a write transistor MN1b, a read transistor MN2b, and an e-fuse EF. A gate of the write transistor MN1b may be connected to a write word line WWL, and a gate of the read transistor MN2b may be connected to a read word line RWL. A drain of the write transistor MN1b may be connected to one end of the e-fuse EF, and a source of the write transistor MN1b may be connected to a ground voltage terminal VSS. A drain of the read transistor MN2b may be connected to a bit line BL, and a source of the read transistor MN2b may be connected to one end of the e-fuse EF. The other end of the e-fuse EF may be connected to a source line SL. In other exemplary embodiments, the fuse device 191 may be embodied, for example, by an arbitrary device including an e-fuse or an anti-fuse.

Figure 20:
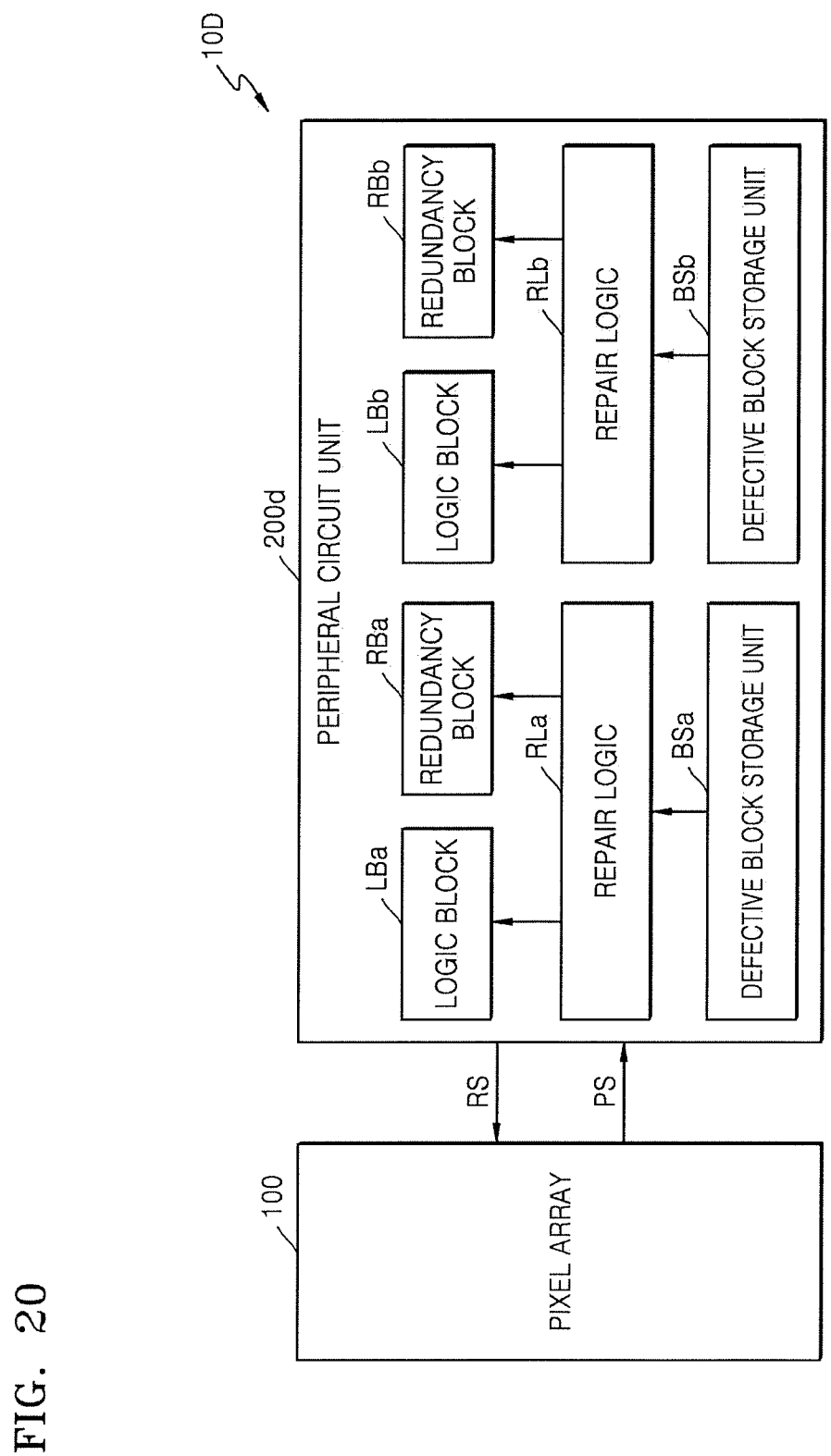
FIG. 20 illustrates another embodiment of an image sensor.

FIG. 20 illustrates an embodiment of image sensor 10D which includes a pixel array 100 and a peripheral circuit unit 200d. The peripheral circuit unit 200d may include a plurality of logic blocks LBa and LBb, a plurality of redundancy blocks RBa and RBb, a plurality of repair logics RLa and RLb, and a plurality of defective block storage units BSa and BSb. According to the present embodiment, the image sensor 10D may include repair logics and defective block storage units according to the number of logic blocks. Each repair logic RLa and RLb may perform a repair operation on a corresponding logic block. Each of the defective block storage units BSa and BSb may perform a repair operation on a corresponding redundancy block.

The redundancy block RBa may be, for example, a block corresponding to the logic block LBa and may replace the logic block LBa when the logic block LBa is a defective block. The repair logic RLa and the defective block storage unit BSa may be a repair unit corresponding to the logic block LBa and the redundancy block RBa, and may select the logic block LBa or the redundancy block RBa based on a test result. The defective block storage unit BSa may store bad block information indicating results generated by testing the logic block LBa or the redundancy block RBa. The repair logic RLa may perform a repair operation on the logic block LBa and the redundancy block RBa based on the defective block information stored in defective block storage unit BSa.

The redundancy block RBb may be a block corresponding to the logic block LBb and may replace by the logic block LBb when the logic block LBb is a defective block. The repair logic RLb and the defective block storage unit BSb may be a repair unit corresponding to the logic block LBb and the redundancy block RBb and may select the logic block LBb or the redundancy block RBb based on a test result. The defective block storage unit BSb may store defective block information indicating results generated by testing the logic block LBb or the redundancy block RBb. The repair logic RLb may perform a repair operation on the logic block LBb and the redundancy block RBb based on the defective block information stored in defective block storage unit BSb.

Figure 21:
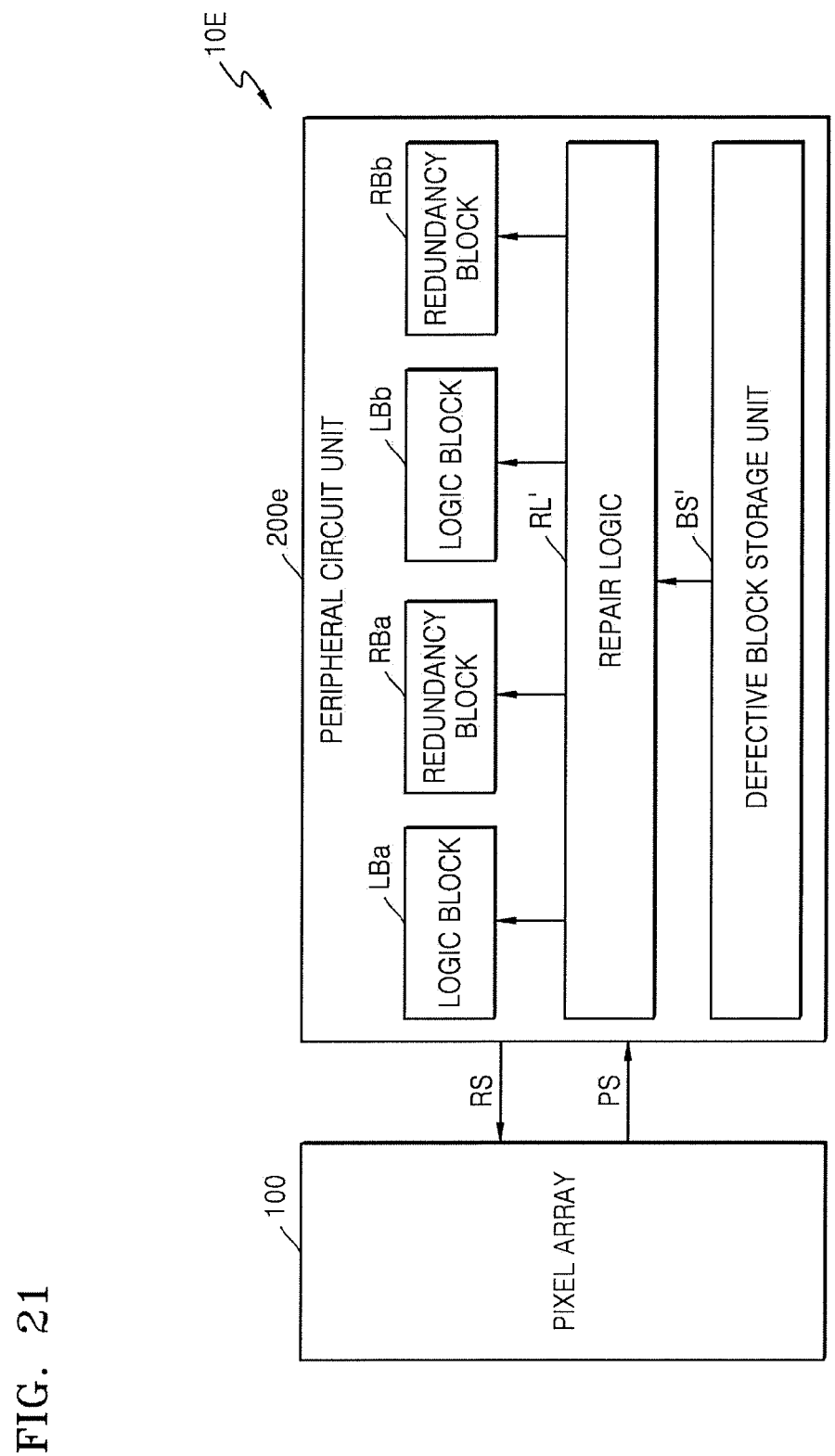
FIG. 21 illustrates another embodiment of an image sensor.

FIG. 21 illustrates an embodiment of image sensor 10E which includes a pixel array 100 and a peripheral circuit unit 200e. The peripheral circuit unit 200e may include a plurality of logic blocks LBa and LBb, a plurality of redundancy blocks RBa and RBb, a repair logic RL', and a defective block storage unit BS'. According to the present embodiment, in the image sensor 10E, the repair logic RU and the defective block storage unit BS' may perform repair operations on the logic blocks LBa and LBb and the redundancy blocks RBa and RBb.

The redundancy block RBa may be, for example, a block corresponding to the logic block LBa and may replace the logic block LBa when the logic block LBa is a defective block. Also, the redundancy block RBb may be a block corresponding to the logic block LBb and may replace the logic block LBb when the logic block LBb is a defective block. The repair logic RL' and the defective block storage unit BS' may be a repair unit corresponding to the logic block LBa and the redundancy block RBa and may select the logic block LBa or the redundancy block RBa based on a test result.

The defective block storage unit BS' may store defective block information indicating results generated by testing the logic blocks LBa and LBb or the redundancy blocks RBa and RBb. In an exemplary embodiment, the defective block storage unit BS' may be divided into a plurality of defective block storage groups respectively corresponding to the logic blocks LBa and LBb. The repair logic RL' may perform a repair operation on the logic blocks LBa and LBb and the redundancy blocks RBa and RBb based on the defective block information stored in the defective block storage unit BS'. In an exemplary embodiment, the repair logic RL' may be divided into a plurality of repair logic groups respectively corresponding to the logic blocks LBa and LBb.

Figure 22:
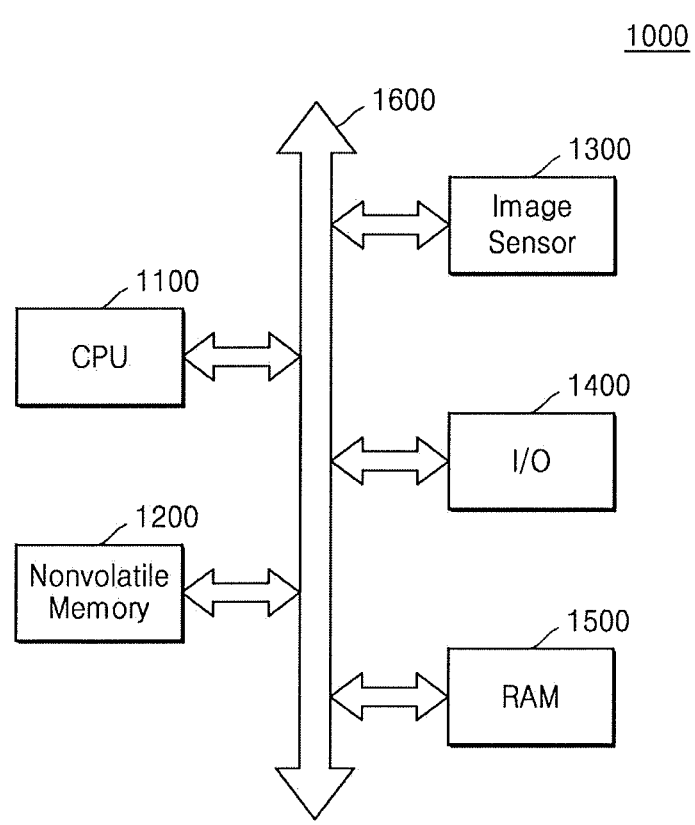
FIG. 22 illustrates an embodiment of a system including an image sensor.

FIG. 22 illustrates an embodiment of a system 1000 including an image sensor 1300. Referring to FIG. 22, the system 1000 may be, for example, a computing system, a camera system, a scanner, a car navigation system, a video phone, a security system, or a motion detecting system, which uses image data.

As shown in FIG. 22, the system 1000 may include a central processing unit (CPU) (or a processor) 1100, a non-volatile memory 1200, an image sensor 1300, an input/output (I/O) device 1400, and a random access memory (RAM) 1500. The CPU 1100 may communicate with the non-volatile memory 1200, the image sensor 1300, the I/O device 1400, and the RAM 1500 via a bus 1600. The image sensor 1300 may be embodied by an independent semiconductor chip or combined with the CPU 1100 into a single semiconductor chip. The image sensor 1300 may be embodied according to the exemplary embodiments described above with reference to FIGS. 1 to 21.

The CPU 1100 may control the system 1000 and exchange data with other components via the bus 1600. For example, the CPU 1100 may receive data generated by the image sensor 1300 according to an exemplary embodiment. The non-volatile memory 1200 may be a memory for retaining stored data even when power supply is interrupted. For example, the non-volatile memory 1200 may store data generated by the image sensor 1300 or data obtained by processing the generated data. The RAM 1500 may function as a data memory of the CPU 1100 and be a volatile memory device. The I/O device 1400 may receive commands from a user of the system 1000 or output images and/or voices to the user.

Figure 23:
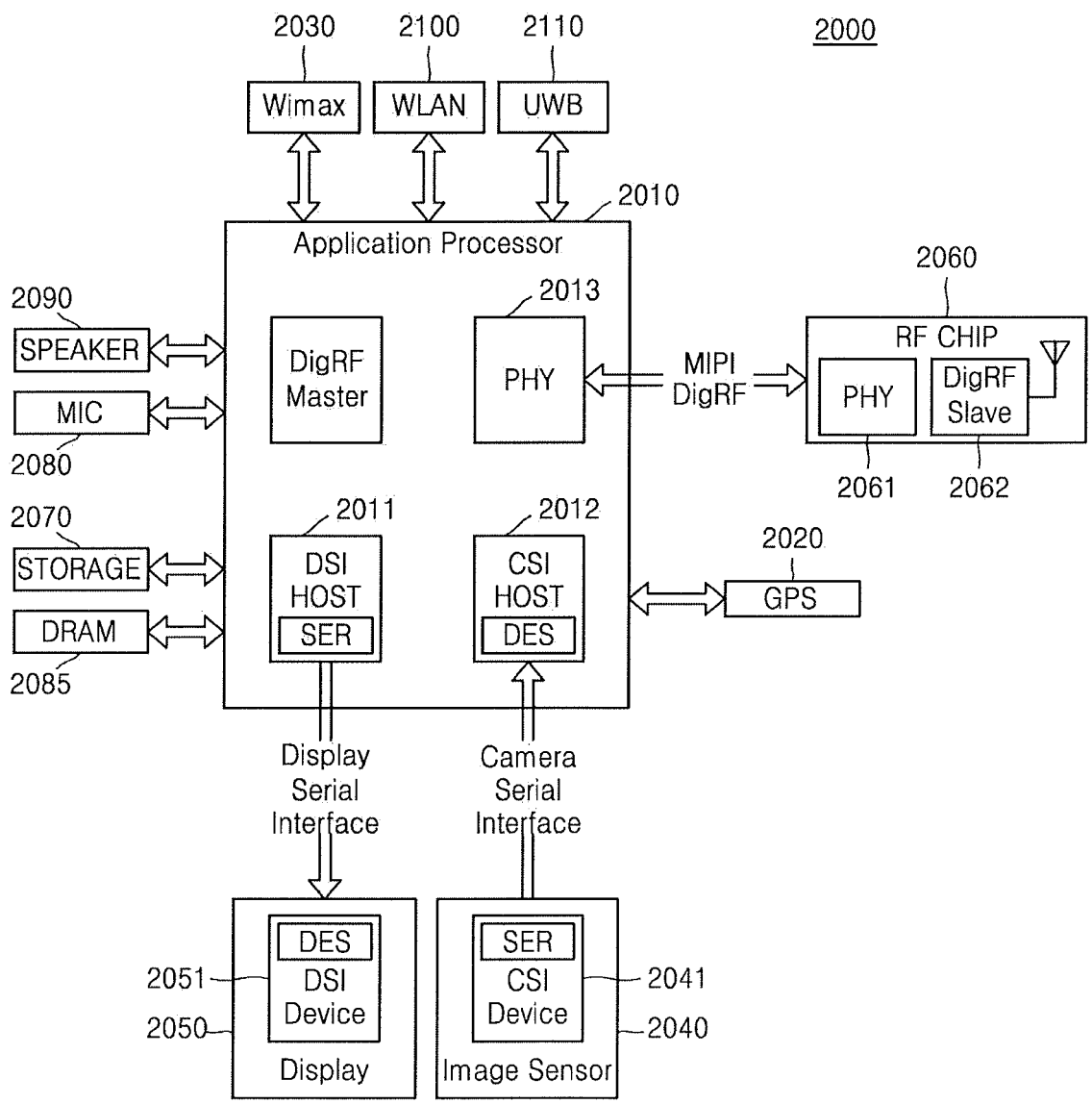
FIG. 23 illustrates an embodiment of an electronic system and interface including an image sensor.

FIG. 23 illustrates an embodiment of an electronic system 2000 and interface including an image sensor. Referring to FIG. 23, the electronic system 2000 may be, for example, a data processing device (e.g., a mobile phone, a personal digital assistant (PDA), a portable multimedia player (PMP), or a smartphone) using or supporting a mobile industry processor interface (MIPI). The electronic system 2000 may include an application processor 2010, an image sensor 2040, and a display 2050. The image sensor 2040 may be embodied according to the exemplary embodiments described above with reference to FIGS. 1 to 22.

A camera serial interface (CSI) host 2012 in the application processor 2010 may serial-communicate with a CSI device 2041 of the image sensor 2040 via a CSI. An optical deserializer may be provided in the CSI host 2012 and an optical serializer may be provided in the CSI device 2041.

A display serial interface (DSI) host 2011 in the application processor 2010 may serial-communicate with a DSI device 2051 of the display 2050 via a DSI. In this case, for example, an optical serializer may be provided in the DSI host 2011, and an optical deserializer may be provided in the DSI device 2051.

The electronic system 2000 may further include an RF chip 2060 for communicating with the application processor 2010. A PHY 2013 of the electronic system 2000 may exchange data with a PHY 2061 of the RF chip 2060 based on MIPI DigRF. The electronic system 2000 may further include a global positioning system (GPS) 2020, a storage 2070, a mike 2080, a dynamic random access memory (DRAM) 2085, and a speaker 2090. The electronic system 2000 may perform communication operations using a worldwide interoperability for microwave access (WiMAX) 2030, a wireless local area network (WLAN) 2100, and an ultra-wideband (UWB) 2110.

The image sensors and stacked image sensors according to the above-described exemplary embodiments may be embodied by packages having various shapes. For example, at least some elements of the image sensors and stacked image sensors may be packaged using a Package on Package (PoP) technique, a ball grid array (BGA) technique, a chip-scale package (CSP) technique, a plastic-leaded chip carrier (PLCC) technique, a plastic dual in-line package (PDIP) technique, a die-in-waffle-pack technique, a die-in-wafer-form technique, a chip-on-board (COB) technique, a ceramic dual in-line package(CERDIP) technique, a plastic metric quad flat-pack (MQFP) technique, a thin quad flat-pack (TQFP) technique, a small outline integrated circuit (SOIC) technique, a shrink small outline package (SSOP) technique, a thin small outline package (TSOP) technique, a thin quad flatpack (TQFP) technique, a system-in-package (SIP) technique, a multi-chip package (MCP) technique, a wafer-level fabricated package (WFP) technique, or a wafer-level processed stack package (WSP) technique.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The units, logic, and other processing features of the described embodiments may be implemented in hardware, software, or both. When implemented at least partially in hardware, the units, logic, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the units, logic, and processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail. the code or instructions for implementing the operations of the method embodiments may transform the computer, processor, controller, or other signal processing device into a special-purpose processor for performing the methods described herein.

By way of summation and review, current image sensors include an active pixel sensor (APS) with a pixel array and a peripheral circuit unit with logic blocks formed on a single wafer. Thus, there is no spare space into which a redundancy block for a logic block may be inserted. Moreover, a stack image sensor may be formed by stacking a first wafer and a second wafer and bonding the first and second wafers to each other. An APS having a pixel array is formed on the first wafer, and a peripheral circuit unit having logic blocks may be formed on the second wafer. In this case, if at least one of the logic blocks formed on the second wafer fails, the entire stacked image sensor may be failed, thus greatly decreasing yield.

In accordance with one or more of the aforementioned embodiments, the yield during mass production of image sensors may be increased. This may be accomplished, for example, by providing an image sensor which includes a logic block and a redundancy block corresponding to the logic block. If testing of the logic block indicates that the logic block is defective, the logic block may be replaced by the redundancy block. Thus, yield of mass production of image sensors may be increased.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. An image sensor, comprising:
a pixel array including a plurality of pixels; and
a peripheral circuit electrically connected to the pixel array, wherein the peripheral circuit includes a logic block including a plurality of logic devices for an entirety of the pixel array and at least two redundancy blocks, each designed to correspond to the logic block, including a plurality of redundant logic devices for the entirety of the pixel array to replace the logic block when the logic block is a defective block, the logic block being disposed adjacent to the at least two redundancy blocks according to a first direction,
wherein, when the logic block is the defective block, the entirety of the pixel array is disconnected from the logic block and electrically connected to the at least one redundancy block.

2. The image sensor as claimed in claim 1, wherein the peripheral circuit includes a repair circuit to select one of the logic block or the at least one redundancy block based on a test result of the logic block or the at least one redundancy block.

3. The image sensor as claimed in claim 2, wherein the repair circuit includes:
a defective block storage area to store defective block information indicating results of testing the logic block or the at least one redundancy block; and
repair logic to select one of the logic block or the at least one redundancy block based on the defective block information.

4. The image sensor as claimed in claim 3, wherein the defective block storage area includes a one-time programmable (OTP) memory block or a fuse block.

5. The image sensor as claimed in claim 2, wherein:
the peripheral circuit includes a plurality of unique logic blocks that perform different signal processing operations,
the repair circuit includes a plurality of repair logic respectively corresponding to each of the plurality of unique logic blocks, and
each repair logic to select a corresponding unique logic block or a unique redundancy block for the corresponding unique logic block based on results of testing the corresponding logic block.

6. The image sensor as claimed in claim 2, wherein:
the peripheral circuit includes a plurality of logic blocks,
the repair circuit includes repair logic to select at least one of the logic blocks or a corresponding redundancy block based on results of testing the logic blocks.

7. The image sensor as claimed in claim 1, wherein:
the pixel array is on a first wafer,
the peripheral circuit is on a second wafer, and
the first wafer is vertically stacked on the second wafer.

8. The image sensor as claimed in claim 1, wherein:
the pixel array is on a first region of a wafer, and
the peripheral circuit is on a second region of the wafer.

9. The image sensor as claimed in claim 1, wherein:
the logic block includes a row driver to select at least one of the pixels, and
the at least one redundancy block includes at least one redundancy row driver to replace the row driver.

10. The image sensor as claimed in claim 1, wherein:
the logic block includes a correlated double sampling (CDS) block to perform a CDS operation on a pixel signal output by the pixel array and output a CDS pixel signal, and
the at least one redundancy block includes at least one redundancy CDS block to replace the CDS block.

11. The image sensor as claimed in claim 10, wherein the logic block includes:
a comparator block to compare the CDS pixel signal with a ramp signal and output a comparison signal, and
the at least one redundancy block includes at least one redundancy comparator block to replace the comparator block.

12. The image sensor as claimed in claim 11, wherein:
the logic block includes an analog-to-digital converting (ADC) block to count the comparison signal in response to a clock signal and output digital data, and
the at least one redundancy block includes at least one redundancy ADC block to replace the ADC block.

13. The image sensor as claimed in claim 12, wherein:
the logic block includes a buffer to store the digital data in frame units, and
the at least one redundancy block includes at least one redundancy buffer to replace the buffer.

14. The image sensor as claimed in claim 11, wherein:
the logic block includes a ramp signal generator to generate the ramp signal, and
the at least one redundancy block includes at least one redundancy ramp signal generator to replace the ramp signal generator.

15. The image sensor as claimed in claim 10, wherein:
the logic block includes a timing generator to generate a timing signal for controlling an operation of the CDS block, and
the at least one redundancy block includes at least one redundancy timing generator to replace the timing generator.

16. A stacked image sensor, comprising:
a first chip including a pixel array of a plurality of pixels; and
a second chip electrically connected to the pixel array and including a logic block including a plurality of logic devices for an entirety of the pixel array and at least two redundancy blocks each designed to correspond to the logic block, including a plurality of redundant logic devices for the entirety of the pixel array to replace the logic block when the logic block is a defective block, the logic block being disposed adjacent to the at least two redundancy blocks according to a first direction, wherein the first and second chips are vertically stacked, wherein, when the logic block is the defective block, the entirety of the pixel array is disconnected from the logic block and electrically connected to the at least one redundancy block.

17. The stacked image sensor as claimed in claim 16, wherein the first chip includes:
   a color filter layer on a first surface of the first chip and over the pixel array; and
   a microlens layer on the color filter layer on the first surface of the first chip, wherein the second chip is adjacent to a second surface of the first chip, which is opposite to the first surface of the first chip.

18. The stacked image sensor as claimed in claim 16, further comprising:
   an interconnector to electrically connect the first and second chips.

19. An image processing apparatus, comprising:
   an image sensor; and
   a digital signal processor to process image data output from the image sensor and to display the processed image data, wherein the image sensor includes:
   a pixel array including a plurality of pixels; and
   a peripheral circuit electrically connected to the pixel array and including a logic block including a plurality of logic devices for an entirety of the pixel array and at least two redundancy blocks each designed to correspond to the logic block, including a plurality of redundant logic devices for the entirety of the pixel array to replace the logic block when the logic block is a defective block, the logic block being disposed adjacent to the at least two redundancy blocks according to a first direction, wherein, when the logic block is the defective block, the entirety of the pixel array is disconnected from the logic block and electrically connected to the at least one redundancy block.

20. The apparatus as claimed in claim 19, wherein:

the image sensor is a stacked image sensor, the pixel array is on a first wafer, the peripheral circuit is on a second wafer, and the first wafer is vertically stacked on the second wafer.

\* \* \* \* \*